United States Patent
Yamazaki et al.

(10) Patent No.: US 7,307,282 B2
(45) Date of Patent: *Dec. 11, 2007

(54) THIN FILM TRANSISTORS AND SEMICONDUCTOR DEVICE

(75) Inventors: Shunpei Yamazaki, Tokyo (JP); Toru Mitsuki, Kanagawa (JP); Kenji Kasahara, Kanagawa (JP); Taketomi Asami, Kanagawa (JP); Tamae Takano, Kanagawa (JP); Takeshi Shichi, Kanagawa (JP); Chiho Kokubo, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 312 days.

This patent is subject to a terminal disclaimer.

(21) Appl. No.: 10/727,651

(22) Filed: Dec. 5, 2003

(65) Prior Publication Data

US 2004/0108576 A1    Jun. 10, 2004

Related U.S. Application Data

(62) Division of application No. 09/874,204, filed on Jun. 6, 2001, now Pat. No. 6,690,068.

(30) Foreign Application Priority Data

| Jun. 12, 2000 | (JP) | ............................. 2000-176173 |
| Jun. 12, 2000 | (JP) | ............................. 2000-176188 |
| Jun. 13, 2000 | (JP) | ............................. 2000-177641 |
| Jun. 13, 2000 | (JP) | ............................. 2000-177652 |

(51) Int. Cl.
    *H01L 29/04* (2006.01)

(52) U.S. Cl. ............................. 257/72; 257/59; 257/64; 257/65; 257/66; 257/627; 257/628; 257/E21.413; 257/E27.111; 257/E29.137; 257/E29.151; 257/E29.279

(58) Field of Classification Search .................. 257/72, 257/64–66, 359, 627–628, 59
See application file for complete search history.

(56) References Cited

U.S. PATENT DOCUMENTS 4,766,477 A    8/1988  Nakagawa et al.

(Continued)

FOREIGN PATENT DOCUMENTS

DE    19825081    12/1998

(Continued)

OTHER PUBLICATIONS

Partial European Search Report (Application No. 01114265.0), Aug. 13, 2004, 4 pages.

(Continued)

*Primary Examiner*—A. Sefer
(74) *Attorney, Agent, or Firm*—Fish & Richardson P.C.

(57) ABSTRACT

The TFT has a channel-forming region formed of a crystalline semiconductor film obtained by heat-treating and crystallizing an amorphous semiconductor film containing silicon as a main component and germanium in an amount of not smaller than 0.1 atomic % but not larger than 10 atomic % while adding a metal element thereto, wherein not smaller than 20% of the lattice plane {101} has an angle of not larger than 10 degrees with respect to the surface of the semiconductor film, not larger than 3% of the lattice plane {001} has an angle of not larger than 10 degrees with respect to the surface of the semiconductor film, and not larger than 5% of the lattice plane {111} has an angle of not larger than 10 degrees with respect to the surface of the semiconductor film as detected by the electron backscatter diffraction pattern method.

34 Claims, 19 Drawing Sheets

U.S. PATENT DOCUMENTS

| | | | |
|---|---|---|---|
| 5,162,933 | A | 11/1992 | Kakuda et al. |
| 5,304,407 | A | 4/1994 | Hayashi et al. |
| 5,602,424 | A | 2/1997 | Tsubouchi et al. |
| 5,643,826 | A | 7/1997 | Ohtani et al. |
| 5,686,980 | A | 11/1997 | Hirayama et al. |
| 5,923,962 | A | 7/1999 | Ohtani et al. |
| 5,932,893 | A | 8/1999 | Miyanaga et al. |
| 5,943,560 | A | 8/1999 | Change et al. |
| 5,977,560 | A | 11/1999 | Banerjee et al. |
| 6,087,679 | A | 7/2000 | Yamazaki et al. |
| 6,107,639 | A | 8/2000 | Yamazaki et al. |
| 6,107,654 | A | 8/2000 | Yamazaki |
| 6,180,957 | B1 | 1/2001 | Miyasaka et al. |
| 6,285,042 | B1 | 9/2001 | Ohtani et al. |
| 6,307,214 | B1 | 10/2001 | Ohtani et al. |
| 6,307,220 | B1 | 10/2001 | Yamazaki |
| 6,335,541 | B1 | 1/2002 | Ohtani et al. |
| 6,348,368 | B1 | 2/2002 | Yamazaki et al. |
| 6,452,211 | B1 | 9/2002 | Ohtani et al. |
| 6,495,886 | B1 | 12/2002 | Yamazaki et al. |
| 6,657,227 | B2 * | 12/2003 | Tamura et al. ............... 257/64 |
| 6,690,068 | B2 | 2/2004 | Yamazaki et al. |
| 6,787,807 | B2 * | 9/2004 | Yamazaki et al. ............ 257/65 |
| 6,828,587 | B2 * | 12/2004 | Yamazaki et al. ............ 257/72 |
| 6,956,235 | B2 * | 10/2005 | Yamazaki et al. ............ 257/65 |
| 2002/0008286 | A1 | 1/2002 | Yamazaki et al. |
| 2002/0014625 | A1 | 2/2002 | Asami et al. |
| 2002/0038889 | A1 * | 4/2002 | Yamazaki et al. ............ 257/347 |
| 2002/0040981 | A1 * | 4/2002 | Yamazaki et al. ............ 257/65 |
| 2002/0043662 | A1 | 4/2002 | Yamazaki et al. |
| 2003/0001159 | A1 | 1/2003 | Ohtani et al. |
| 2003/0102480 | A1 | 6/2003 | Yamazaki et al. |

FOREIGN PATENT DOCUMENTS

| | | | |
|---|---|---|---|
| DE | 19833237 | | 1/1999 |
| EP | 510969 | | 4/1991 |
| EP | 984317 | | 3/2000 |
| JP | 02-219234 | | 8/1990 |
| JP | 4-349619 | | 12/1992 |
| JP | 07-086602 | | 3/1995 |
| JP | 7-130652 | | 5/1995 |
| JP | 8-78329 | | 3/1996 |
| JP | 09-082639 | | 3/1997 |
| JP | 11-186563 | * | 7/1999 |
| JP | 11-204434 | | 7/1999 |
| JP | 11-284198 | | 10/1999 |
| JP | 11-307783 | | 11/1999 |
| JP | 11-345767 | * | 12/1999 |
| JP | 2001-035787 | | 2/2001 |
| JP | 2002-025907 | | 1/2002 |
| TW | 251379 | | 7/1995 |
| TW | 310478 | | 7/1997 |

OTHER PUBLICATIONS

Australian Patent Office Search Report and Written Opinion (Singapore Application No. 200407844-0), dated Aug. 25, 2006, 8 pages.

Search / Examination Report dated May 28, 2005 (Malaysian Application No. PI 20012712, filed Jun. 11, 2001)—3 pages.

R. Ishihara et al.; "Micro Texture Analysis Of Location Controlled Large Si Grain Formed by Exciter-Laser Crystallization Method"; *AMLCD '99 Digest of Technical Papers 1999 Tokyo, Japan*; pp. 99-102; 1999.

Seok-Woon Lee et al.; "Low Temperature Poly-Si Thin-Film Transistor Fabrication by Metal-Induced Lateral Crystallization"; *IEEE Electron Device Letters, vol. 17, No. 4*, pp. 160-162; Apr. 1996.

* cited by examiner

CRYSTAL AXIS

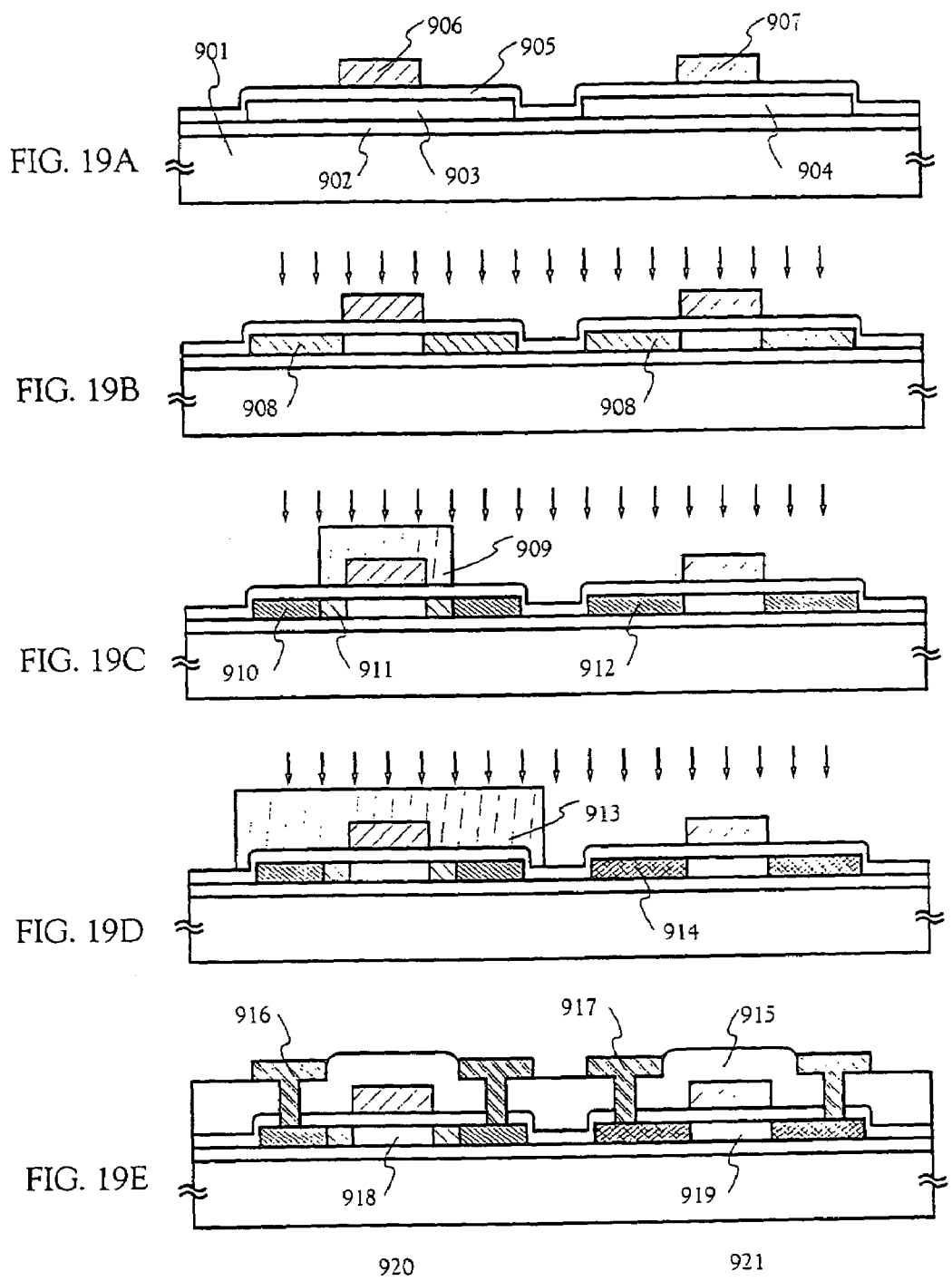

THIN FILM TRANSISTORS AND SEMICONDUCTOR DEVICE

CROSS-REFERENCE TO RELATED APPLICATIONS

This application is a divisional application of U.S. application Ser. No. 09/874,204, filed on Jun. 6, 2001, now U. S. Pat. No. 6,690,068, which claims the benefit from foreign priority applications filed in Japan, as serial number 2000-176173, filed Jun. 12, 2000, serial number 2000-176188, filed Jun. 12, 2000, serial number 2000-177641, filed Jun. 13, 2000, and serial number 2000-177652, filed Jun. 13, 2000. This application claims priority to all of these applications, and all of these applications are incorporated by reference.

BACKGROUND OF THE INVENTION

1. [Field of the Invention]

This invention relates to thin film transistors using a semiconductor film of crystals that are collected having various azimuths (hereinafter referred to as crystalline semiconductor film) as represented by a polycrystalline silicon film, and a semiconductor device formed by using the above thin film transistors. In particular, the invention relates to a semiconductor film forming a channel-forming region, a source region and a drain region of a thin film transistor and to a semiconductor device mounting the above thin film transistors. In this specification, the semiconductor device refers to devices that work by utilizing semiconductor characteristics as a whole inclusive of display devices as represented by a liquid crystal display device and semiconductor integrated circuits (microprocessors, signal processing circuits and high-frequency circuits).

2. [Prior Art]

There has been developed a technology for fabricating thin film transistors (hereinafter abbreviated as TFTs) by forming a crystalline semiconductor film on a glass substrate or on a quartz substrate. Application of this technology has been forwarded in a field of flat panel displays as represented by an active matrix liquid crystal display device. TFTs are used as switching elements in the pixels or as elements for forming a driver circuit formed in the peripheries of the pixels.

Silicon is chiefly used as a material of a crystalline semiconductor film for forming the channel-forming regions, source regions, drain regions or low-concentration drain (lightly doped drain: LLD) regions in active regions of TFTs. The silicon film having a crystalline structure (hereinafter referred to as crystalline silicon film) is formed by subjecting an amorphous silicon film deposited on a substrate by a plasma CVD method or a low pressure CVD method to the heat treatment or to the irradiation with a laser beam (hereinafter referred to as laser treatment in this specification).

In conducting the heat treatment, however, the heating must be effected at a temperature of not lower than 600° C. for not less than 10 hours to crystalize the amorphous silicon film. The above treating temperature and the treating time are not necessarily suitable from the standpoint of productivity of the TFTs. When a liquid crystal display device is taken into consideration as an applied product using TFTs, a heating furnace of a large size is necessary to cope with an increase in the area of the substrate, not only consuming energy in large amounts in the steps of production but also making it difficult to obtain homogeneous crystals over a wide area. In the case of the laser treatment, it is difficult to obtain homogeneous crystals due to the lack of stability in the output of the laser oscillator. Dispersion in the quality of crystals could become a cause of dispersion in the TFT characteristics, and deteriorates the quality of display of the liquid crystal display devices and the EL display devices.

There has also been proposed a technology for forming a crystalline silicon film through the heat treatment at a temperature lower than the temperatures employed thus far by introducing, into the amorphous silicon film, metal elements that assist the crystallization of silicon. According to, for example, Japanese Patent Application (Kokai) Nos. 7-130652 and 8-78329, a crystalline silicon film is obtained by the heat treatment conducted at 550° C. for 4 hours by introducing such a metal element as nickel into the amorphous silicon film.

In the crystalline silicon film formed by the above conventional methods, however, the planes of crystalline azimuth exist in a random fashion, and the ratio of orientation is low for particular crystalline azimuths. The crystalline silicon film obtained by the heat treatment or the laser treatment permits plural crystalline particles to be precipitated and oriented on {111}. Even when limited to the plane azimuth, however, the ratio of orientation did not exceed 20% of the whole film.

When the ratio of orientation is low, it is almost impossible to maintain continuity of lattice on the crystalline grain boundaries where the crystals of different azimuths abut to each other, and it is estimated that unpaired bonds are formed much. The unpaired bonds on the grain boundaries could become centers of trapping the carriers (electrons/holes) accounting for a drop in the carrier transport property. That is, since the carriers are scattered and trapped, a TFT having a high electric-field mobility cannot be expected despite the TFT is fabricated by using the above crystalline semiconductor film. Besides, since the crystalline grain boundaries exist in a random fashion, it is difficult to form the channel-forming region using crystalline particles having a particular crystalline azimuth, and electric characteristics of the TFT tend to become dispersed.

SUMMARY OF THE INVENTION

It is an object of this invention to provide means for solving the above-mentioned problems, and to provide TFTs using a crystalline semiconductor film which is obtained by crystallizing an amorphous semiconductor film and is highly oriented, as well as to provide a semiconductor device mounting the above TFTs.

This invention provides a TFT having a channel-forming region formed of a crystalline semiconductor film obtained by heat-treating and crystallizing an amorphous semiconductor film containing silicon as a main component and germanium in an amount of not smaller than 0.1 atomic % but not larger than 10 atomic % (preferably, not smaller than 1 atomic % but not larger than 5 atomic %) while adding a metal element thereto, wherein an orientation ratio of the lattice plane {101} is not smaller than 20% and the lattice plane {101} has an angle of not larger than 10 degrees with respect to the surface of the semiconductor film, and an orientation ratio of the lattice plane {001} is not larger than 3% and the lattice plane {001} has an angle of not larger than 10 degrees with respect to the surface of the semiconductor film, and an orientation ratio of the lattice plane {001} is not larger than 5% and the lattice plane {111} has an angle of not larger than 10 degrees with respect to the surface of the semiconductor film as detected by the electron backscatter diffraction pattern method.

The invention further provides a TFT having a channel-forming region formed of a crystalline semiconductor film obtained by heat-treating and crystallizing an amorphous semiconductor film containing silicon as a main component and germanium in an amount of not smaller than 0.1 atomic % but not larger than 10 atomic % (preferably, not smaller than 1 atomic % but not larger than 5 atomic %) while adding a metal element thereto, wherein an orientation ratio of the lattice plane {101} is not smaller than 5% and the lattice plane {101} has an angle of not larger than 5 degrees with respect to the surface of the semiconductor film, an orientation ratio of the lattice plane {001} is not larger than 3% and the lattice plane {001} has an angle of not larger than 10 degrees with respect to the surface of the semiconductor film, and an orientation ratio of the lattice plane {001} is not larger than 5% and the lattice plane {111} has an angle of not larger than 10 degrees with respect to the surface of the semiconductor film as detected by the electron backscatter diffraction pattern method.

The invention further provides a TFT having a channel-forming region formed of a highly oriented crystalline semiconductor film having a thickness of from 20 nm to 100 nm and containing nitrogen and carbon at concentrations of smaller than $5\times10^{18}/cm^3$, containing oxygen at a concentration of smaller than $1\times10^{19}/cm^3$, and containing the metal element at a concentration of smaller than $1\times10^{17}/cm^3$.

The invention further provides a semiconductor device having a channel-forming region formed of a semiconductor film obtained by heat-treating and crystallizing an amorphous semiconductor film containing silicon as a main component and germanium in an amount of not smaller than 0.1 atomic % but not larger than 10 atomic % (preferably, not smaller than 1 atomic % but not larger than 5 atomic %) while adding a metal element thereto, wherein an orientation ratio of the lattice plane {101} is not smaller than 20% and the lattice plane {101} has an angle of not larger than 10 degrees with respect to the surface of the semiconductor film, and an orientation ratio of the lattice plane {001} is not larger than 3% and the lattice plane {001} has an angle of not larger than 10 degrees with respect to the surface of the semiconductor film, and an orientation ratio of the lattice plane {001} is not larger than 5% and the lattice plane {111} has an angle of not larger than 10 degrees with respect to the surface of the semiconductor film as detected by the electron backscatter diffraction pattern method.

The invention further provides a semiconductor device having a channel-forming region formed of a semiconductor film obtained by heat-treating and crystallizing an amorphous semiconductor film containing silicon as a chief component and germanium in an amount of not smaller than 0.1 atomic % but not larger than 10 atomic % (preferably, not smaller than 1 atomic % but not larger than 5 atomic %) while adding a metal element thereto, wherein an orientation ratio of the lattice plane {101} is not smaller than 5% and the lattice plane {101} has an angle of not larger than 5 degrees with respect to the surface of the semiconductor film, an orientation ratio of the lattice plane {001} is not larger than 3% and the lattice plane {001} has an angle of not larger than 10 degrees with respect to the surface of the semiconductor film, and an orientation ratio of the lattice plane {001} is not larger than 5% and the lattice plane {111} has an angle of not larger than 10 degrees with respect to the surface of the semiconductor film as detected by the electron backscatter diffraction pattern method.

The invention further provides a semiconductor device having a channel-forming region formed of a highly oriented crystalline semiconductor film having a thickness of from 20 nm to 100 nm and containing nitrogen and carbon at concentrations of smaller than $5\times10^{18}/cm^3$, containing oxygen at a concentration of smaller than $1\times10^{19}/cm^3$, and containing the metal element at a concentration of smaller than $1\times10^{17}/cm^3$.

The metal element that is added is one or more of those selected from Fe, Co, Ni, Ru, Rh, Pd, Os, Ir, Pt, Cu and Au. The amorphous silicon film to which the metal element is added is heat-treated to thereby form a compound (silicide compound) of silicon with the metal element. This compound then diffuses to assist the crystallization. Germanium that is added to the amorphous silicon does not react with this compound but stays in the peripheries thereof to build up local strain. The strain works to increase the critical radius of the formation of nuclei and, hence, to decrease the density of the formation of nuclei. The strain further limits the orientation of crystals.

To produce the above-mentioned action, it has been learned through experiment that germanium needs to be added in an amount of not smaller than 0.1 atomic % but not larger than 10 atomic % (preferably, not smaller than 1 atomic % but not larger than 5 atomic %). When germanium is added in amounts larger than the above range, nuclei are formed spontaneously and conspicuously (crystalline nuclei that are not dependent upon the compound of the added metal element) as an alloy of silicon and germanium, making it difficult to increase the ratio of orientation of the obtained crystalline semiconductor film. When germanium is added in too small amounts, strain does not build up to a sufficient degree making it difficult to increase the ratio of orientation, either.

When the amorphous semiconductor film is crystallized, the volume of the film contracts due to the rearrangement of atoms if viewed macroscopically. As a result, tensile stress occurs in the crystalline semiconductor film formed on the substrate. Upon containing germanium having an atomic radius larger than that of silicon at a concentration of 0.1 to 10 atomic %, preferably, 1 to 3 atomic %, however, the contraction of volume due to the crystallization is suppressed, and a small internal stress occurs. That is, upon containing germanium at a concentration as contemplated by this invention, the strain in the crystalline semiconductor film can be relaxed.

The distribution of crystalline azimuths can be found by using an electron backscatter diffraction pattern (EBSP). The EBSP is a method of analyzing the crystalline azimuth from the backscattering of primary electrons by providing a scanning electron microscope (SEM) with a special detector (hereinafter, this method is referred to as EBSP method for convenience). FIG. 2 is a diagram illustrating the principle thereof. An electron gun (Schottky field-effect emission electron gun) 201, a mirror 202 and a sample chamber 203 are constituted in the same manner as those of an ordinary scanning electron microscope. To measure the EBSP, a stage 204 is tilted at an angle of about 60 degrees, and a sample 209 is installed. In this state, a screen 205 of a detector 206 is inserted so as to face the sample. Reference numeral 207 indicates an electron beam; 208, a backscattered electron.

Here, when an electron ray falls on the sample having a crystalline structure, non-elastic scattering also takes place on the back side thereof, and there can be also observed a linear pattern (generally called Kikuchi image) specific to the crystalline azimuth due to Bragg diffraction in the sample. According to the EBSP method, the Kikuchi image reflected on the detector screen is analyzed to find the crystalline azimuth of the sample.

FIG. 3 illustrates a crystalline semiconductor film 302 of a polycrystalline structure formed on a substrate 301. The crystalline semiconductor film 302 has a prerequisite in that each crystalline particle therein has a different crystalline azimuth. Upon repeating (mapping) the azimuthal analysis while moving a position of the sample where the electron beam falls, the data related to the crystalline azimuth or to the orientation can be obtained concerning the planar sample. The thickness of the incident electron beam 303 varies depending upon the type of the electron gun of the scanning electron microscope. In the case of the Schottky electric-field emission electron gun, an electron beam of as very fine as 10 to 20 nm can be projected. In the mapping, more highly averaged data of crystal orientation are obtained with an increase in the number of the measuring points or with an increase in the area of the measured region. In practice, about 10000 points (a gap of 1 μm) to about 40000 points (0.5 μm) are measured over a region of 100×100 μm². Reference numeral 304 indicates a backscattered electron.

When the crystalline azimuths of the crystalline particles are all found by mapping, the state of crystal orientation for the film can be expressed in a statistic manner. FIG. 4A is a diagram illustrating back poles found by the EBSP method. The diagram of the back poles is frequently used for displaying the preferential orientation of a polycrystalline substance and collectively represents which lattice plane a particular plane (surface of the film, here) of the sample is in agreement with.

A fan-shaped frame of FIG. 4A is usually called a standard triangle in which are included all indexes of the cubic crystal system. The length in this diagram corresponds to an angle in the crystalline azimuth. For example, an angle of 45 degrees is defined by {001} and {101}, an angle of 35.26 degrees is defined by {101} and {111}, and an angle of 54.74 degrees is defined by {111} and {001}. White dotted lines represent ranges of shearing angles of 5 degrees and 10 degrees from {101}.

FIG. 4A is the one in which all measuring points (11655 points in this example) in the mapping are plotted within the standard triangle. It will be learned that the density is high near the point {101}. FIG. 4B shows the concentration of such points using contour lines. These are the values of an azimuth distribution function, and the concentration (density of points of FIG. 4A) is represented by a contour line in the case when a random orientation is presumed. Here, the values represent magnifications of when it is presumed that the crystalline particles are oriented in a quite orderless manner, i.e., when the points are evenly distributed in the standard triangle, and are the values without dimension.

When it is learned that the crystalline particles are preferentially oriented to a particular index (here, {101}), the ratio of the number of crystalline particles collected near the index is indicated by a numerical value, so that the degree of preferential orientation can be easily imagined. In the diagram of back poles shown in FIG. 4A, for example, the ratio of the number of points present in a range between a shearing angle of 5 degrees and a shearing angle of 10 degrees from {101} (indicated by white dotted lines in the drawing) to the total number of the points can be expressed as a ratio of orientation in compliance with the following formula.

{101} Ratio of orientation = [Formula 1]

number of measured points within an allowable angle between the lattice plane {101} and the film surface/total number of the measured points This ratio can be explained in a manner as described below. When the distribution is concentrated near {101} as in FIG. 4A, the individual particles in a real film have an azimuth <101> nearly perpendicular to the substrate as shown in FIG. 6 but are expected to be arranged being fluctuated thereabout. The allowable values of the angle of fluctuation are set to be 5 degrees and 10 degrees, and the ratio of those smaller than these values are numerically expressed. Reference numeral 601 indicates a substrate; 602, a crystalline semiconductor film. In FIG. 5, for example, the azimuth <101> 505 of a given crystalline particle is not included in an allowable range of 5 degrees 503 but is included in an allowable range of 10 degrees 504. In the data appearing later, the allowable shearing angles are set to be 5 degrees and 10 degrees as described above, and the ratio of crystalline particles satisfying this is expressed. Reference numeral 501 indicates surface of a film; 502, a perpendicular line of surface.

In the diagram of back poles shown in FIG. 4A, the vertexes are {101}, {111} and {001}, and the other plane azimuth appears as the shearing value increases relative to {101}. As the shearing angle from {101} becomes 30 degrees, then, {112} develops. When the ratio of existence of crystalline azimuth is to be determined by the EBSP, therefore, the allowable shearing angle must be determined for the crystalline particles that are distributed in a fluctuated manner so as not to include other indexes. The present inventors have discovered that the ratio of existence of crystalline particles oriented in a particular azimuth can be quantitatively expressed by collecting the data while setting the allowable shearing angle to be smaller than 10 degrees or smaller than 5 degrees.

BRIEF DESCRIPTION OF THE DRAWINGS

FIGS. 19A-19E are diagrams illustrating the steps of fabricating TFTs of a CMOS structure of Embodiment 6;

DESCRIPTION OF THE PREFERRED EMBODIMENTS

Embodiment Mode

Figure 1:
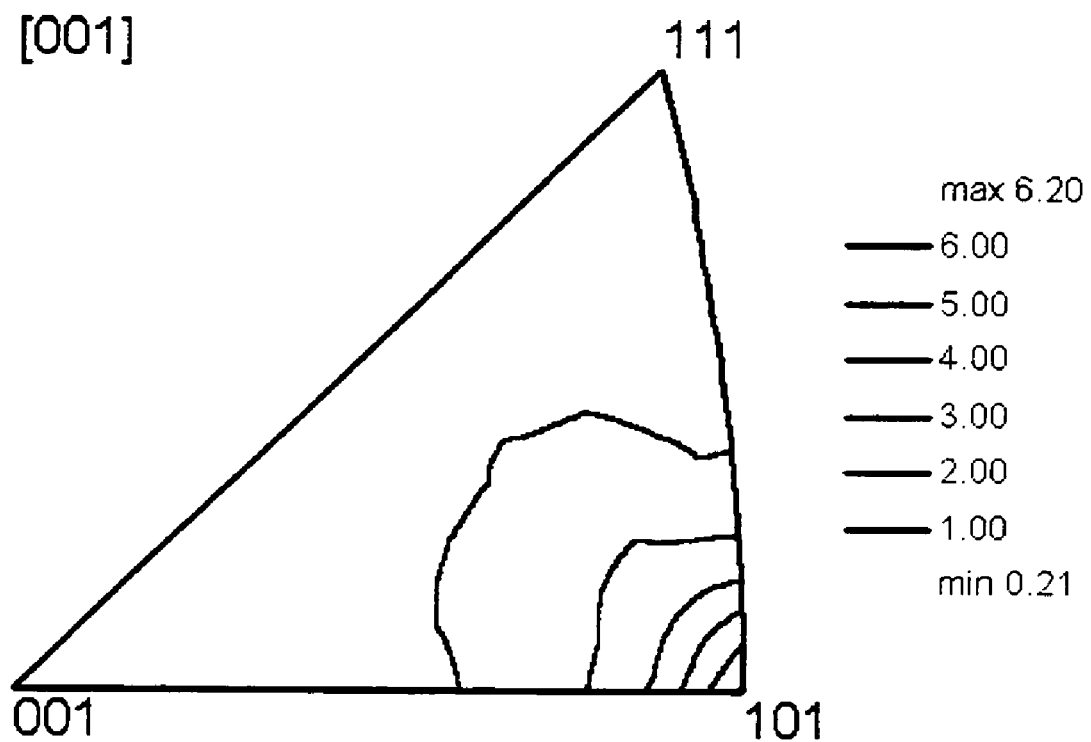
FIG. 1 is a diagram of back poles of a crystalline semiconductor film of the invention found by the EBSP method.
Figure 2:
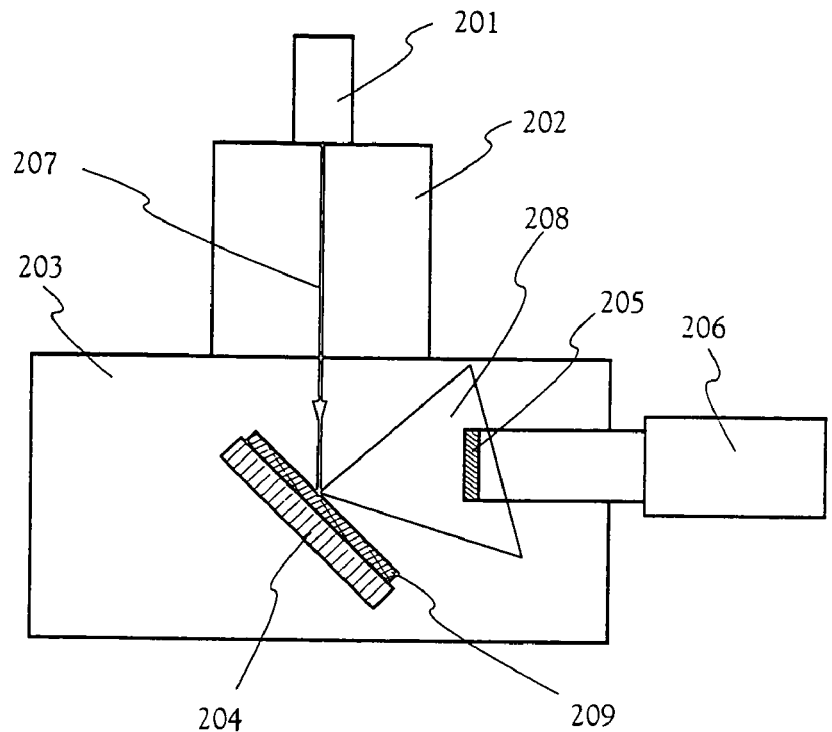
FIG. 2 is a diagram illustrating the constitution of an EBSP device of the present invention.
Figure 3:
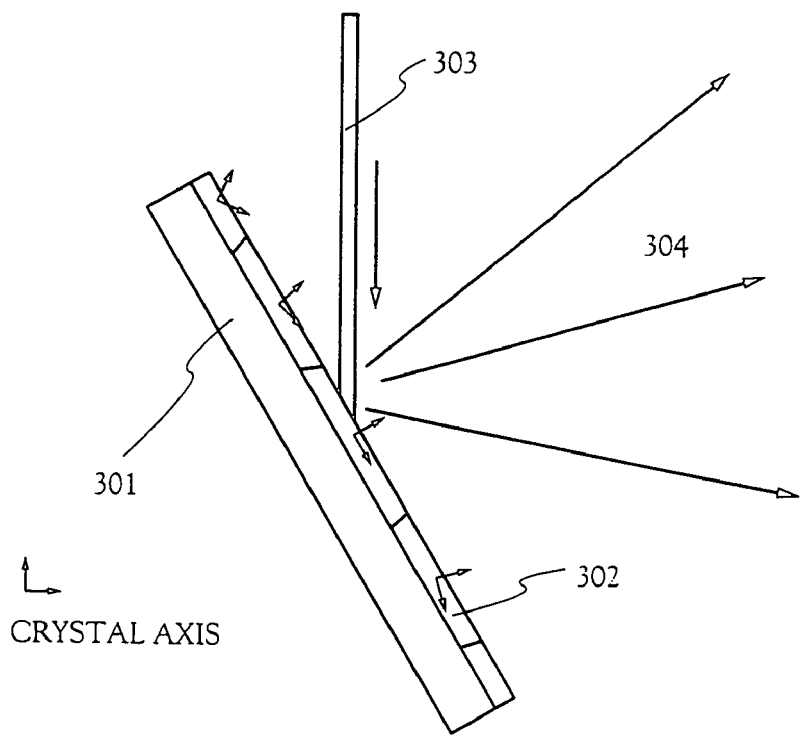
FIG. 3 is a diagram illustrating the concept of measuring a sample by the EBSP of the present invention.
Figure 4A:
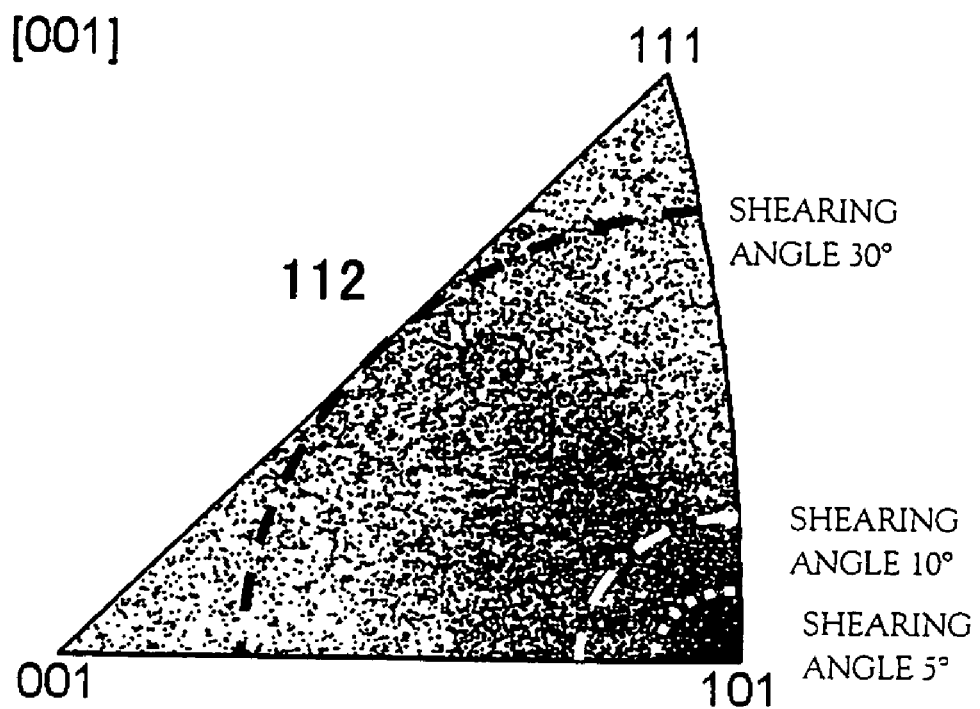
FIGS. 4A and 4B are diagrams of back poles obtained from the EBSP data of the present invention.
Figure 4B:
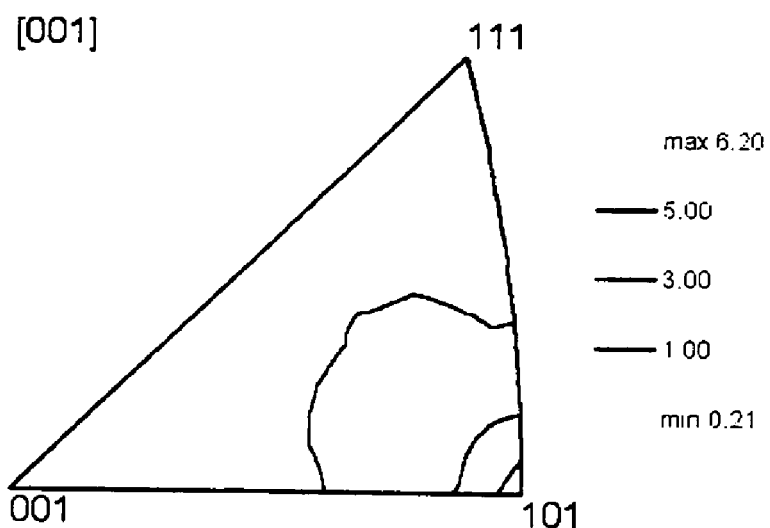
Figure 5:
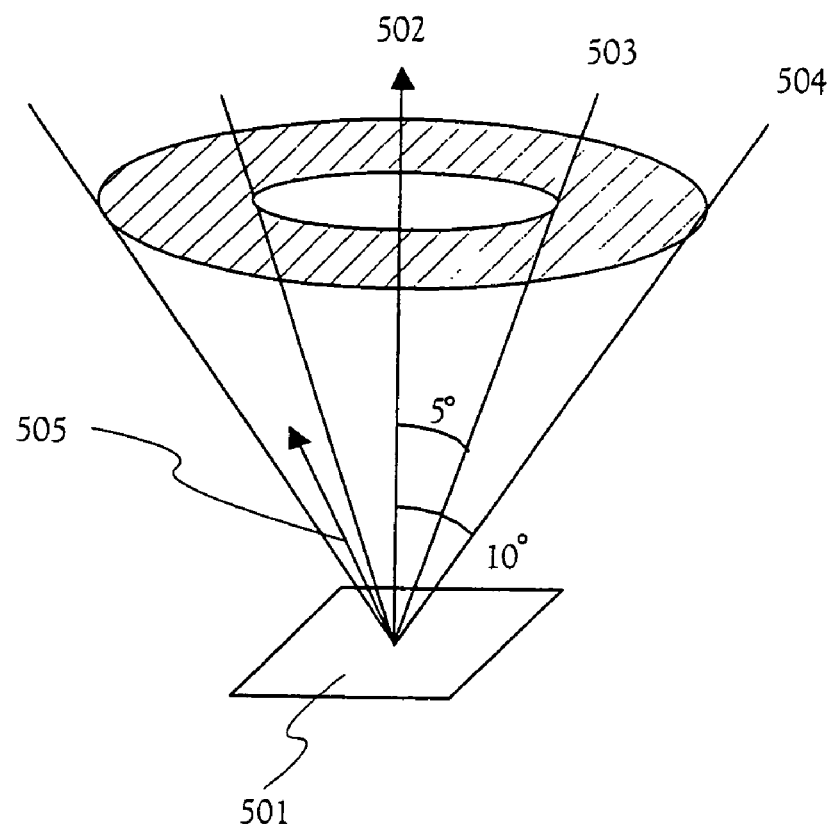
FIG. 5 is a diagram illustrating shearing angles from the {101} orientation of the present invention.
Figure 6:
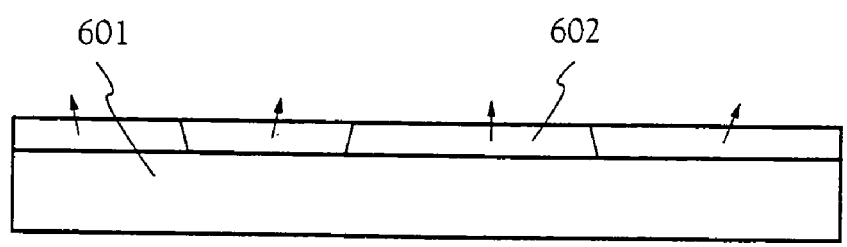
FIG. 6 is a diagram illustrating the fluctuation in the <101> azimuth of crystalline particles preferentially oriented near {101} of the present invention.

This invention has a feature in that the crystalline semiconductor film used as the channel-forming region of a TFT is the one containing, as a main component, silicon which is highly oriented on the {101} lattice plane. According to a representative embodiment for obtaining the crystalline semiconductor film, a metal element is introduced into the surface of an amorphous semiconductor film formed by a plasma CVD method or a low pressure CVD method by using a gas of a hydride, a fluoride or a chloride of silicon atoms and germanium atoms in order to assist the crystallization of the amorphous semiconductor film, and a crystalline semiconductor film is formed by the heat-treatment by utilizing the metal element.

As the substrate for forming the crystalline semiconductor film, there can be suitably used an alkali-free glass substrate such as an alumina borosilicate glass or barium borosilicate glass. Typically, a #7059 glass substrate or a #1737 glass substrate of Coning Co. is used. There can be further used a quartz substrate or a sapphire substrate. Or, an insulating film may be formed on the surface of a semiconductor substrate of silicon, germanium, gallium, or arsenic to use it as a substrate.

When the above glass substrate is used, a blocking layer of silicon nitride, silicon oxide or silicon nitride oxide is formed between the amorphous semiconductor film and the glass substrate. This prevents impurity elements such as alkali metal elements contained in the glass substrate from diffusing into the semiconductor film. For example, $SiH_4$, $NH_3$ and $N_2$ are used as reaction gases in the plasma CVD method to form a silicon nitride film. Or, $SiH_4$, $N_2O$ and $NH_3$ are used as reaction gases to form a silicon nitride oxide film. The blocking layer is formed maintaining a thickness of 20 to 200 nm.

The amorphous semiconductor film is formed on the substrate by the plasma CVD method, low pressure CVD method or by any other suitable method. When the plasma CVD method is applied, the reaction gas of $SiH_4$ and $GeH_4$ or the reaction gas of $GeH_4$ diluted with $SiH_4$ and $H_2$ is added and introduced into the reaction chamber and is decomposed by a high-frequency electric discharge of 1 to 200 MHz to deposit an amorphous semiconductor film on the substrate. The reaction gas may contain $Si_2H_6$ or $SiF_4$ instead of $SiH_4$, or may contain $GeF_4$ instead of $GeH_4$. Even when the low pressure CVD method is employed, a similar reaction gas may be used. Preferably, the reaction gas is diluted with He, and an amorphous semiconductor film is deposited on the substrate at a temperature of 400 to 500° C. In any way, the gas used in this invention is the one that is highly purified to decrease the concentrations of impurity elements such as oxygen, nitrogen, carbon that may be trapped by the amorphous semiconductor film that is deposited. The amorphous semiconductor film that is deposited has a thickness in a range of from 20 to 100 nm.

The amorphous semiconductor film used in this invention contains silicon as a main component and germanium in an amount of not smaller than 0.1 atomic % but not larger than 10 atomic % (preferably, not smaller than 1 atomic % but not larger than 5 atomic %). The content of germanium can be adjusted relying upon the mixing ratio of $SiH_4$ and $GeH_4$ used as typical reaction gases. The amorphous semiconductor contains nitrogen and carbon at concentrations of smaller than $5 \times 10^{18}/cm^3$ and oxygen at a concentration of smaller than $1 \times 10^{19}/cm^3$, so that the amorphous semiconductor film will not be adversely affected in the step of crystallization and that electric properties of the crystalline semiconductor film that is formed will not be adversely affected.

A metal element is introduced into the surface of the thus formed amorphous semiconductor film to assist the crystallization of the amorphous semiconductor film. There can be used one or more kinds of metal elements selected from iron (Fe), nickel (Ni), cobalt (Co), ruthenium (Ru), rhodium (Rh), palladium (Pd), osmium (Os), iridium (Ir), platinum (Pt), copper (Cu) and gold (Au). These metal elements can be used for assisting the crystallization of the amorphous semiconductor film in any one of the inventions disclosed in this specification. The same and equal effect can be obtained by using any one of the above metal elements. Typically, however, nickel is used.

The portions into which the metal elements are introduced may be the whole surface of the amorphous semiconductor film, slit-like surfaces or dot-like surfaces at suitable places on the surface of the amorphous semiconductor film. In the former case, the place may be either the surface on the substrate side of the amorphous semiconductor film or the surface on the side opposite to the substrate. In the latter case, an insulating film is preferably formed on the amorphous semiconductor film, and the metal element is introduced through openings formed in the insulating film. There is no particular limitation on the size of the openings, but the width may be 10 to 40 μm. The length in the lengthwise direction may be arbitrarily determined to be, say, from several tens of microns to several tens of centimeters.

There is no particular limitation on the method of introducing these metal elements and any method can be employed provided it forms a metal film on the surface of the amorphous semiconductor film or inside thereof. There can be employed, for example, sputtering method, vaporization method, plasma processing method (inclusive of plasma CVD method), adsorption method or a method of applying a solution of a metal salt. The plasma processing method utilizes the metal element sputtered from a cathode in a glow-discharge atmosphere of an inert gas. The method of applying a solution of a metal salt is useful since it is easy facilitating the adjustment of concentration of the metal element.

As the metal salt, there can be used various salts. As the solvent, there can be used water, alcohols, aldehydes, ethers or any other organic solvent, or a mixture of water and the organic solvents. Further, the solution is not necessarily the one in which the metal salt is completely dissolved therein but may be the one in which part or whole of the metal salt is present in the state of a suspension. Whichever method is employed, the metal element is introduced being dispersed on the surface or inside of the amorphous semiconductor film.

After the metal element is introduced by any one of the above methods, the amorphous semiconductor film is crystallized by utilizing the metal element. The crystallization is effected by the heat treatment, or the irradiation with an intense light such as laser beam, ultraviolet ray or infrared ray. The heat treatment only is enough for obtaining the crystalline silicon film which is preferentially oriented in {101}. Preferably, however, the heat treatment is effected and, then, an intense light such as laser beam is projected. The laser treatment after the heat treatment repairs and extinguishes crystal defects left in the crystalline particles, and is effective in improving the quality of the crystals that are formed.

The heat treatment can be conducted over a range of 450 to 1000° C. The upper limit of temperature is considered as an upper limit of temperature which the substrate that is used can withstand. For example, a quart: substrate can withstand the heat treatment at 1000° C. When the glass substrate is used, however, the upper limit of temperature must not be higher than a distortion point thereof. When, for example, the glass substrate has a distortion point of 667° C., the upper limit should be set to be about 660° C. The required time is suitably set depending upon the heating temperature and the subsequent treating conditions (e.g., whether the treatment is effected being irradiated with a laser beam). Suitably, however, the heat treatment is conducted at 550 to 600° C. for 4 to 24 hours. When the laser treatment follows, the heat treatment is conducted at 500 to 550° C. for 4 to 8 hours. The heat treatment may be conducted in the air or in a hydrogen atmosphere. Preferably, however, the heat treatment is conducted in nitrogen or in an inert gas atmosphere.

The laser treatment is effected by using, as a source of light, an excimer laser of a wavelength of shorter than 400 nm, or second harmonics (wavelength of 532 nm) to fourth harmonics (wavelength of 266 nm) of YAG or YVO$_4$ laser. The laser beam is focused into a line or a spot through an optical system and is projected with an energy density of 100 to 700 mJ/cm$^2$; i.e., the focused laser beam scans the predetermined region of the substrate to execute the processing. It is further allowable to use, instead of the laser, a halogen lamp, a xenon lamp, a mercury lamp or a metal halide lamp as a source of light.

The mechanism of forming the crystalline semiconductor film having a highly oriented plane {101} of this invention through the above steps, has not yet been clarified but is estimated to be as described below.

First, the crystallization is effected by the heat treatment at 400 to 500° C. whereby the metal element reacts with silicon to form a silicide which serves as crystalline nuclei that contribute to growing the crystals. For example, when nickel is used as a representative metal element, there is formed a nickel silicide (hereinafter written as NiSi$_2$). The structure of NiSi$_2$ is that of fluorite in which a nickel atom is arranged between the silicon lattices of the diamond structure. When the nickel atoms are removed from NiSi$_2$, there remains the crystalline structure of silicon. It has been known from extensive experimental results that the nickel atoms migrate toward the side of amorphous silicon presumably due to that the degree of solid solution in the amorphous silicon is higher than that in the crystalline silicon. Therefore, there can be established a model in which nickel forms crystalline silicon while migrating in the amorphous silicon.

NiSi$_2$ is not particularly oriented. When the amorphous semiconductor film has a thickness of 20 to 100 nm, however, the NiSi$_2$ is permitted to grow only in a direction in parallel with the surface of the substrate. In this case, the energy is the smallest on the interface where the NiSi$_2$ comes in contact with the plane (111) of crystalline silicon. Therefore, the plane in parallel with the surface of the crystalline silicon film is a plane (110) and this lattice plane is preferentially oriented. When the direction of growth of crystals is in parallel with the surface of the substrate, and the crystals grow like poles, there exists the degree of freedom in the rotational direction with the pole-like crystal as an axis, and the plane (110) is not necessarily oriented. It is therefore considered that other lattice planes may precipitate.

In order to enhance the orientation of the lattice plane {101} of the crystalline semiconductor film, this invention has contrived means for containing germanium at a concentration of 0.1 to 10 atomic % as means for imposing limitation on the direction of rotation of the pole-like crystals and for decreasing the degree of freedom.

Figure 15:
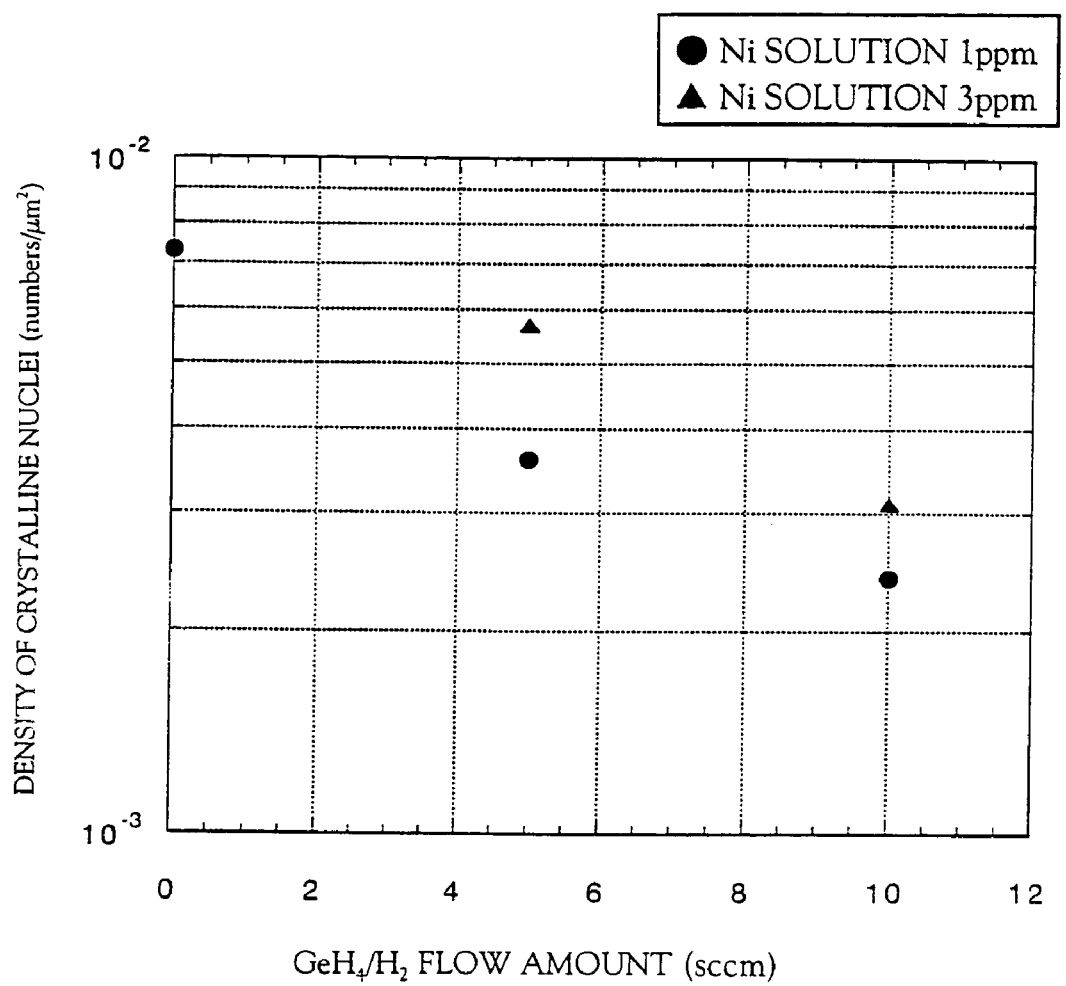
FIG. 15 is a graph illustrating a relationship between the amount of addition of $GeH_4$ and the density of generation of crystalline nuclei of the present invention.

First, it has been observed that the density of formation of crystalline nuclei decreases when germanium is contained in the amorphous silicon at a concentration of 0.1 to 10 atomic %. FIG. 15 shows the results thereof wherein the density of crystalline nuclei decreases with an increase in the amount of GeH$_4$ added at the time of forming the amorphous silicon film, i.e., decreases with an increase in the concentration of germanium trapped by the amorphous silicon film. When NiSi$_2$ that is a crystalline nucleus is formed, it is considered that the crystals are growing while expelling germanium due to a difference in the interatomic distance. Accordingly, germanium segregates on the outer side of the pole-like crystals and it is considered that its presence decreases the freedom in the direction of rotation with the pole-like crystals as axes. As a result, it becomes possible to obtain a crystalline semiconductor film having a highly oriented plane (110).

Next, described below is a relationship between the conditions of formation and the orientation of crystals observed by the EBSP method using the crystalline semiconductor film formed according to the invention described above. Table 1 shows the conditions for forming the amorphous semiconductor film by the plasma CVD method. The high-frequency electric power is 0.35 W/cm$^2$ (27 MHz)

which is modulated into a pulse discharge of a recurring frequency of 10 kHz (duty ratio of 30%) and is fed to the cathode of the plasma CVD device of the flat plate type. Other common conditions include a reaction pressure of 33.25 Pa, a substrate temperature of 300° C. and a distance between electrodes of 35 mm.

TABLE 1

| Item | | SGN30 | SGN10 | SGN5 | SN |
|---|---|---|---|---|---|
| SiH$_4$ flow rate | [sccm] | 70 | 90 | 95 | 100 |
| GeH$_4$(H$_2$ base 10%) flow rate | [sccm] | 30 | 10 | 5 | 0 |
| RF power | [W/cm$^2$] | 0.35 | ← | ← | ← |
| Pulse frequency | [KHz] | 10 | ← | ← | ← |
| Duty | [%] | 30 | ← | ← | ← |
| Pressure | [Pa] | 33.25 | ← | ← | ← |
| Substrate temp (Tsub) | [° C.] | 300 | ← | ← | ← |
| Gap between electrodes (GAP) | [mm] | 35 | ← | ← | ← |

In order to change the content of germanium relative to silicon, the mixing ratio of the flow rate of GeH$_4$ gas diluted into 10% with SiH$_4$ and H$_2$ is changed in a manner that the total flow rate is constant. Under the conditions described in Table 1, the flow rate of GeH$_4$ diluted into 10% with H$_2$ is changed to 30, 10 and 5 sccm under the film-forming conditions #SGN30, #SGN10 and #SGN5. The SiH$_4$ has a purity of not lower than 99.9999%, and GeH$_4$ contains nitrogen and hydrocarbon compounds in amounts of not larger than 1 ppm and CO$_2$ in an amount of not larger than 2 ppm. No GeH$_4$ is added under the condition #SN. The thickness of the amorphous semiconductor film that is deposited is set to be 50 nm for all samples.

Figure 13:
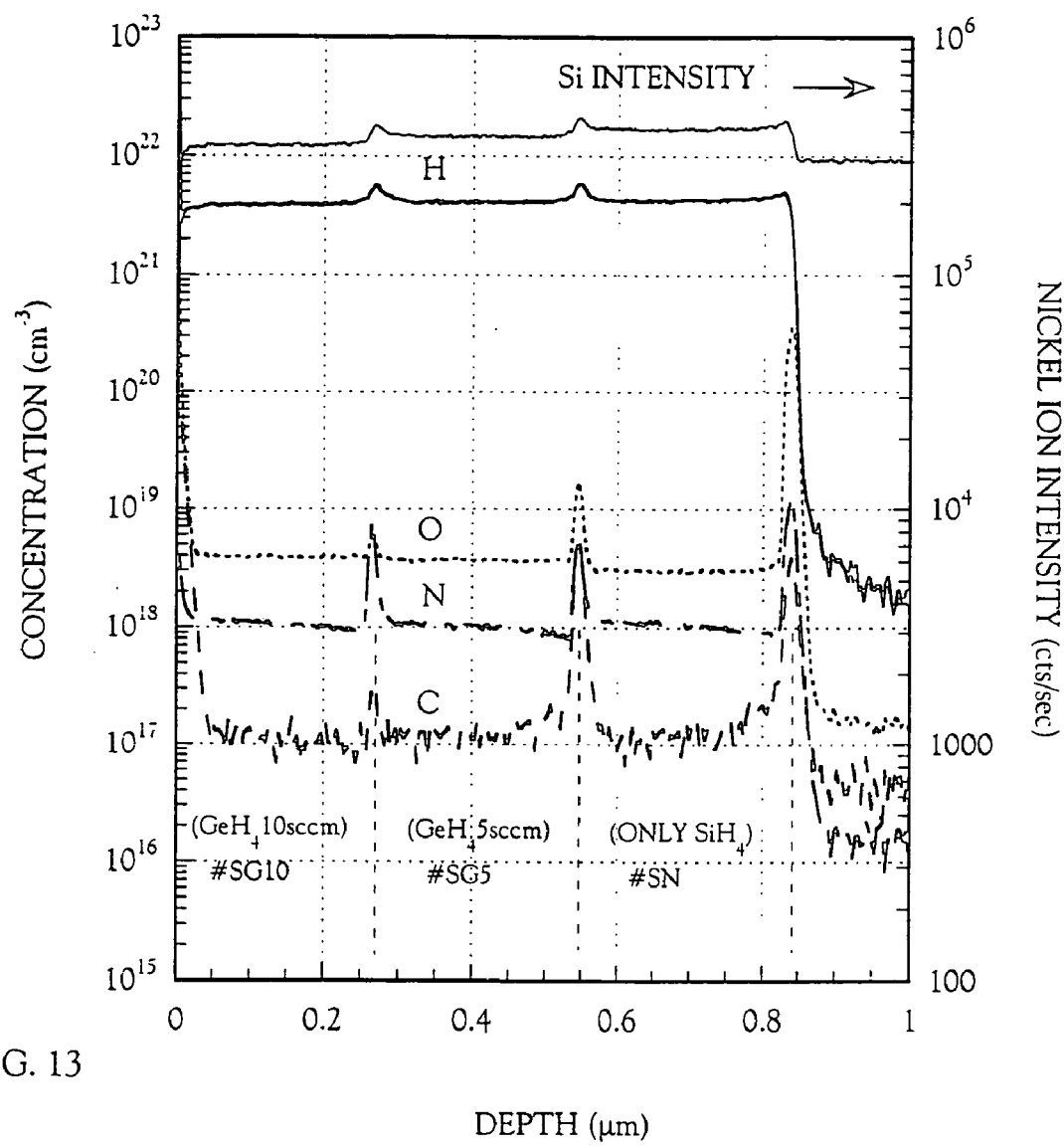
FIG. 13 shows SIMS data expressing C, N and O concentrations of samples by using $SiH_4$, $GeH_4$ and $H_2$ gases of the present invention.

The contents of nitrogen, carbon and oxygen contained in the amorphous semiconductor film formed under such conditions are measured by the secondary ionic mass spectrometric method (SIMS). FIG. 13 shows the results thereof. Samples used for the measurement have films laminated on the silicon substrate in order of #SN, #SGN5, #SGN 10. Under all of these film-forming conditions, the contents of nitrogen and carbon are smaller than 5×10$^{18}$/cm$^3$ and the content of oxygen is smaller than 1×10$^{19}$/cm$^3$.

The thus formed amorphous semiconductor films are crystallized by using nickel as a metal element through the heat treatment at 550° C. in a nitrogen atmosphere for 4 hours and through the laser treatment. Nickel was added by using an aqueous solution containing nickel acetate at a concentration of 10 ppm and by applying it using a spinner. The laser treatment was conducted by using an XeCl excimer laser (wavelength of 308 nm), adjusting the irradiation energy density to be 300 to 600 mJ/cm$^2$, and at an overlapping ratio of 90 to 95%. The laser treatment is effected for crystallizing the uncrystallized portions of the film subjected to the crystallization through the heat treatment and for repairing defects in the crystalline particles.

Defects remaining in the crystalline semiconductor film can be effectively decreased by the hydrogenation treatment to contain hydrogen at a concentration of about 0.01 to 1 atomic %. The hydrogenation can be effected by the heat treatment at 350 to 500° C. in an atmosphere containing hydrogen. It is also possible to effect the hydrogenation by using hydrogen formed by plasma. The film formed by the deposition of a fluoride such as SiF$_4$ or GeF$_4$ permits fluorine to remain in the film at a concentration of 0.001 to 1 atomic % to compensate for the defects.

Figure 14:
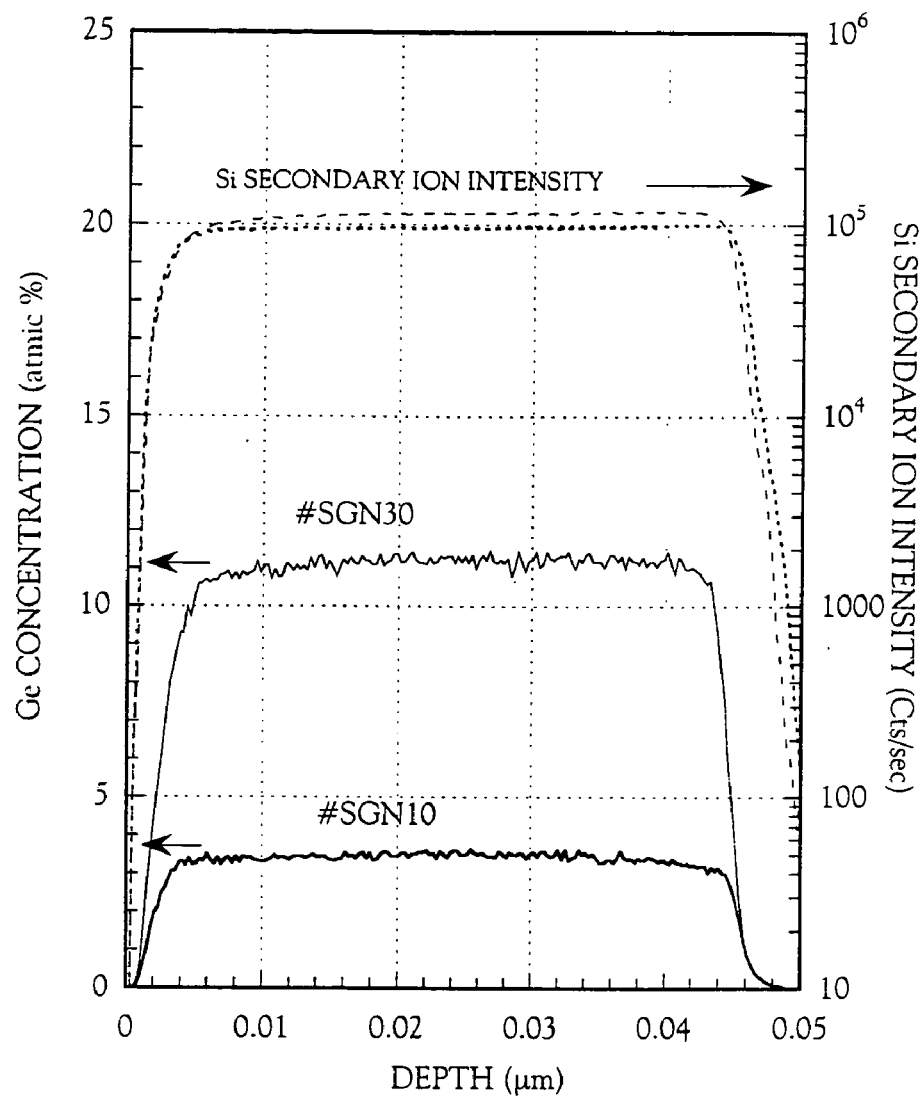
FIG. 14 is a graph showing Ge concentrations of samples (SGN5) and (SGN10) measured by SIMS of the present invention.

FIG. 14 shows the results of evaluating the germanium concentration of the thus crystallized #SGN10 and #SGN30 by the SIMS. The content of germanium for silicon is 3.5 atomic % in #SGN10 and is 11.0 atomic % in #SGN30. When calculated from the flow rate ratio of GeH$_4$ relative to SiH$_4$, germanium is trapped in the film at a ratio 3 to 4 times as large as silicon. This is because, GeH$_4$ is decomposed by the glow discharge requiring energy smaller than the energy required for the SiH$_4$. It is therefore considered that #SGN5 contains germanium at a concentration of about 1.0 atomic %.

Figure 16A:
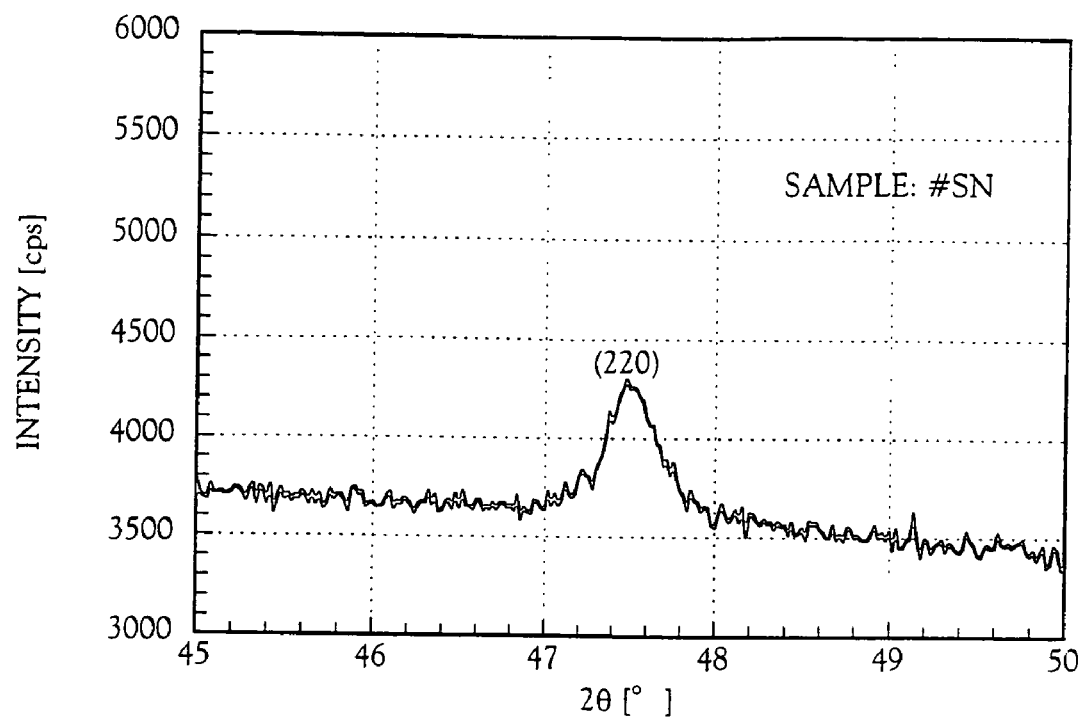
FIGS. 16A and 16B show X-ray diffraction patterns of samples (SN) and (SGN10) by the $\theta$-$2\theta$ method of the present invention.
Figure 16B:
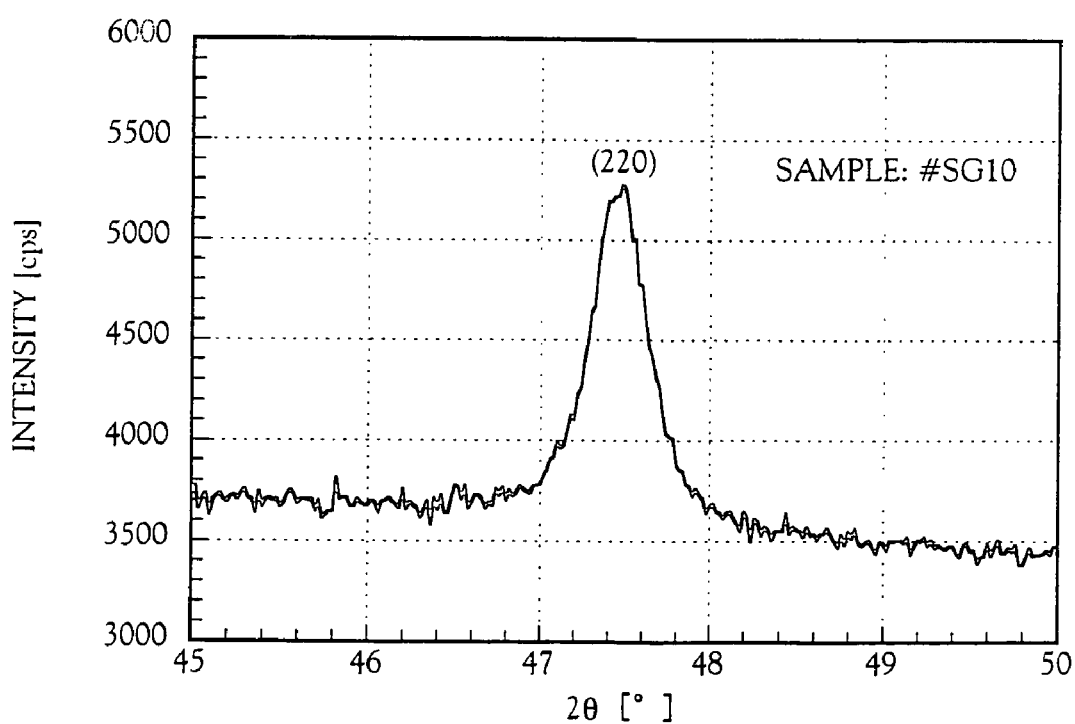

FIG. 16 shows the results of measurement of a diffraction peak (220) of the same sample by the θ-2θ method. The peak position is 47.466 in the sample #SN and 47.417 in the sample #SGN, indicating a shift in the peak position due to the addition of germanium.

Figure 17:
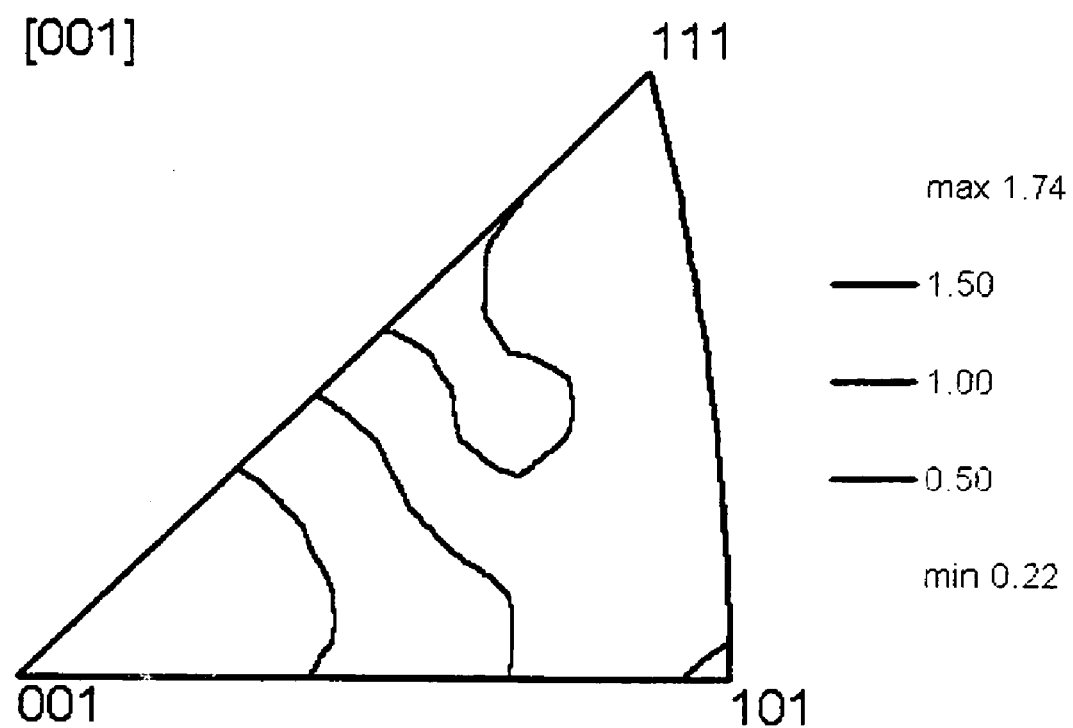
FIG. 17 is a diagram of back poles of the sample (SN) found by the EBSP method of the present invention.
Figure 18:
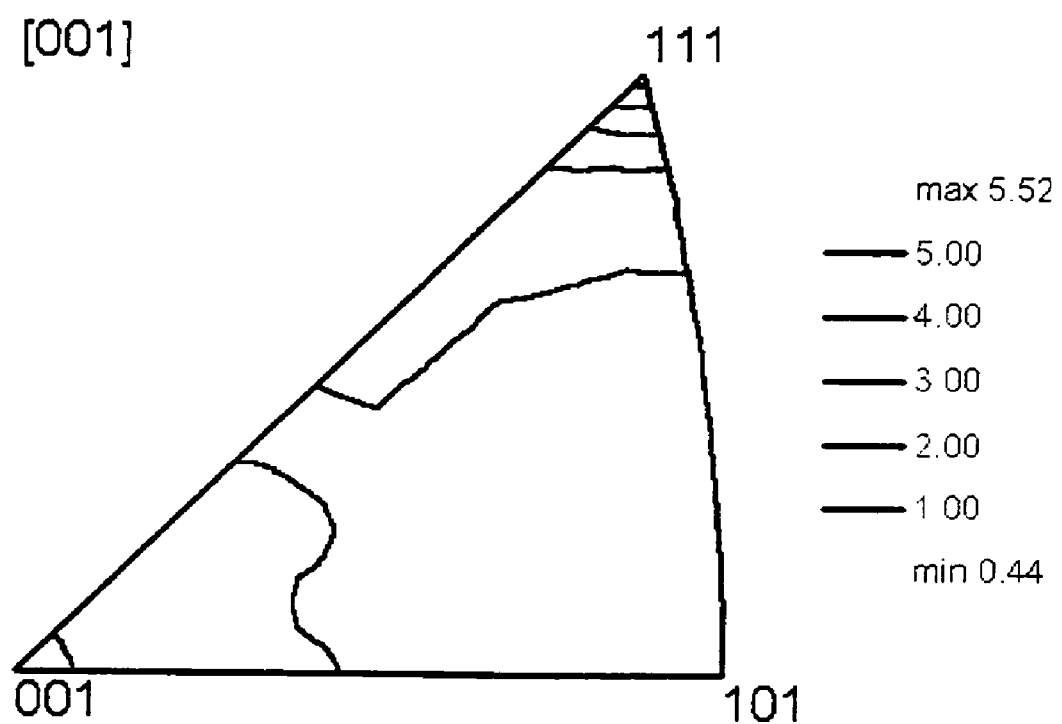
FIG. 18 is a diagram of back poles of the sample (SN) found by the EBSP method of the present invention.

Details of the crystalline azimuth are found by the EBSP method. FIG. 17 is a diagram of back poles of the sample #SN, and FIG. 1 is a diagram of back poles of the sample #SGN10. From the diagrams of back poles, it is observed that the plane {101} is strongly oriented in the sample #SGN10 shown in FIG. 1. In the sample #SN shown in FIG. 17, on the other hand, orientation is seen on the plane {101} and on a plane {311} midway between the plane {001} and the plane {111}. As reference data, further, FIG. 18 is a diagram of back poles of the crystalline silicon film formed on a quartz substrate by the heat treatment at 600° C. for 20 hours. In this case, it is observed that the plane {111} has been strongly oriented.

Table 2 shows the results of orientation ratios of {101}, {001}, {111} and {311} of the samples in a range where the angles of the lattice planes to the surface of the film are not larger than 5 degrees and in a range where the angles of the lattice planes to the surface of the film are not larger than 10 degrees based on the diagram of back poles. In Table 2, #HS is the data corresponding to FIG. 18. In this sample, the planes {311} and {111} are highly oriented, i.e., 18% (not larger than 10 degrees) and 12% (not larger than 10 degrees), respectively. In the sample #SN, the planes {101} and {311} are highly oriented. As for the plane {311}, the number of the equivalent lattice planes is larger than that of other planes from the standpoint of symmetry. With the polycrystalline substance oriented in a random fashion, the probability of occurrence increases correspondingly.

TABLE 2

| | (%) | | | | | | | |
|---|---|---|---|---|---|---|---|---|
| | {101} | | {001} | | {111} | | {311} | |
| Sample | 10° | 5° | 10° | 5° | 10° | 5° | 10° | 5° |
| #SGN30 | 7 | 1 | 8 | 2 | 7 | 3 | 19 | 5 |
| #SGN10 | 31 | 14 | 1 | 0 | 3 | 1 | 10 | 3 |
| #SGN5 | 20 | 6 | 1 | 0 | 3 | 0 | 12 | 3 |
| #SN | 12 | 3 | 1 | 0 | 7 | 2 | 15 | 3 |
| #HS | 4 | 1 | 10 | 3 | 12 | 6 | 18 | 4 |

In the samples #SGN30, #SGN10, #SGN5 to which germanium is added, too, a tendency is exhibited, indicating a change in the orientation of crystals depending upon the concentration of germanium contained in the film. In the samples #SGN10 and #SGN5, what draws a particular attention is that the lattice plane {101} is strongly oriented compared with other lattice planes. In the sample #SGN10, the orientation ratio is 31% within the shearing angle of 10 degrees and is 14% even within 5 degrees. In the sample #SGN5, the orientation ratio is 20% within the shearing angle of 10 degrees and is 6% within 5 degrees. Such very high orientation ratios for the lattice plane {101} are not accomplished with other samples to which germanium is not added.

In the sample #SGN30, however, when the content of germanium in the film increases to 11 atomic %, the orientation ratio on the plane {101} decreases. Therefore, what these results mean is that there exists a suitable range for the concentration of germanium contained in the amorphous silicon film for enhancing the orientation ratio of the plane {101}, and this range of concentration is from 0.1 atomic % to 10 atomic %.

The crystalline semiconductor film exhibiting a high orientation property on the lattice plane {101} is obtained not only by adding germanium at a concentration in a range of from 0.1 to 10 atomic %, but also by suppressing the concentrations of oxygen, nitrogen and carbon in the film to be smaller than $1 \times 10^{19}/cm^3$, preferably, carbon and nitrogen to be smaller than $5 \times 10^{18}/cm^3$ and oxygen to be smaller than $1 \times 10^{19}/cm^3$, and by selecting the film thickness in a range of 20 to 100 nm so as to produce such a synergistic effect that the crystals grow dominantly in a direction in parallel with the surface of the substrate.

The crystalline semiconductor film having a high orientation ratio on the lattice plane {101} can be favorably used as the channel-forming region of TFTs and as the channel-forming region for determining properties of the elements such as photo-electric conversion layer of photo-electromotive devices.

Figure 12A:
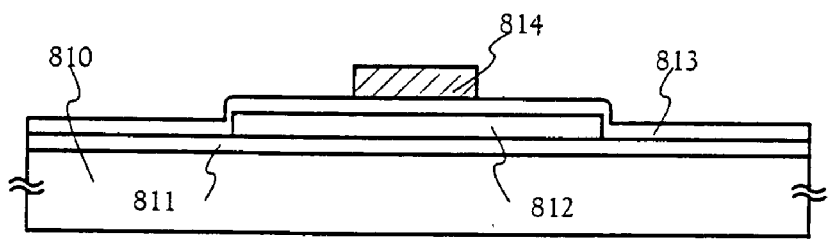
FIGS. 12A-12C are diagrams illustrating a step of fabricating the semiconductor device of the present invention.
Figure 12B:
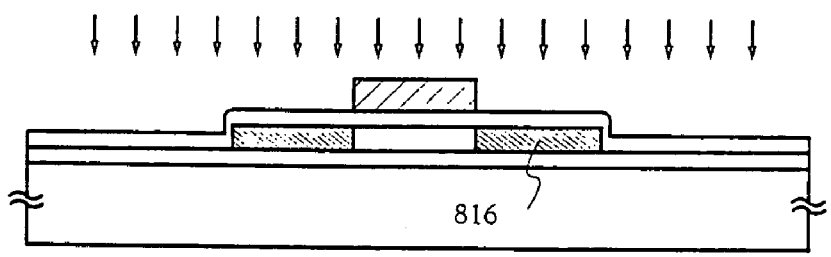
Figure 12C:
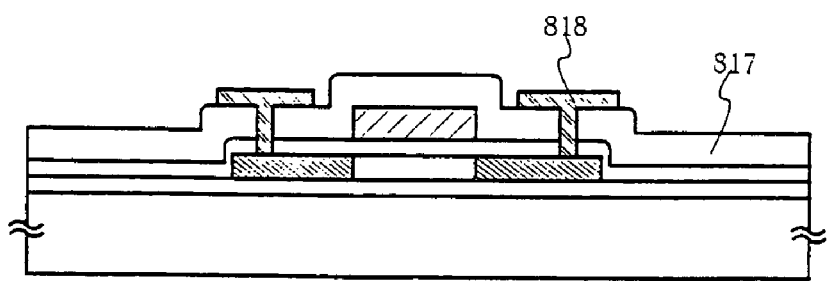

Next, described below is an example of fabricating TFTs by using the crystalline silicon film containing germanium. FIGS. 12A-12C are diagrams illustrating the steps of fabrication of this invention.

In FIG. 12A, a crystalline silicon film 812 containing germanium is formed on a substrate 810. Here, the crystalline silicon film 812 may be any one of those fabricated through the steps of the following Embodiments 1 to 4. To fabricate TFTs, the substrate is etched to a predetermined size for element isolation and is divided into islands. When the substrate 810 is a glass substrate, a blocking layer 811 is formed.

The insulating film 813 is used as a gate-insulating film in the TFTs and is formed in a thickness of 30 to 200 nm. The insulating film 813 is a silicon nitride oxide film formed from $SiH_4$ and $N_2O$ by the plasma CVD method or is a silicon nitride oxide film formed from TEOS or $N_2O$. In this embodiment, the former one is selected and is formed maintaining a thickness of 70 nm. The insulating film 813 may be formed by a method described in Embodiment 5.

On the insulating film 813 is formed a gate electrode 814 of an electrically conducting material containing one or plural kinds of elements selected from tantalum, tungsten, titanium, aluminum and molybdenum.

Referring, next, to FIG. 12B, impurity regions 816 are formed for forming source and drain region of the TFT. The impurity regions 816 are formed by the ion-doping method. When the TFT is of the n-channel type, an element of the Group 15 of periodic table as represented by phosphorus or arsenic is added. When the TFT is of the p-channel type, an element of the Group 13 of periodic table as represented by boron is added.

Thereafter, an interlayer-insulating film 817 is formed by a silicon nitride film or a silicon nitride oxide film relying upon the plasma CVD method. The impurity element that is added must be heat-treated at 350 to 500° C. for being activated. The heat treatment is effected after the interlayer-insulating film 817 has been formed to release hydrogen contained in the silicon nitride film or in the silicon nitride oxide film so as to be diffused in the crystalline silicon film 812 that contains germanium thereby to compensate defects in the crystalline silicon film with hydrogen. Thereafter, source and drain electrodes 818 are formed to obtain the TFT.

The channel-forming region formed of the crystalline silicon film containing germanium and is highly oriented on the lattice plane {101} obtained by the invention, exhibits good interface properties to the gate-insulating film, contains defects at a decreased density on the crystalline grain boundaries and inside the crystalline particles, and exhibits an electric-field effect mobility. Though the TFT described above possessed a single-drain structure, the TFT may be formed having a low-concentration drain (LDD) structure or having a structure in which the LDD is overlapped on the gate electrode. The TFTs formed by the invention can be used as TFTs for fabricating an active matrix liquid crystal display device and EL display device, and as TFTs for realizing a thin film integrated circuit that substitutes for the LSIs fabricated by using conventional semiconductor substrates.

EMBODIMENTS

The invention will be described in further detail by way of Embodiments to which only, however, the invention is in no way limited, as a matter of course.

Embodiment 1

Figure 7A:
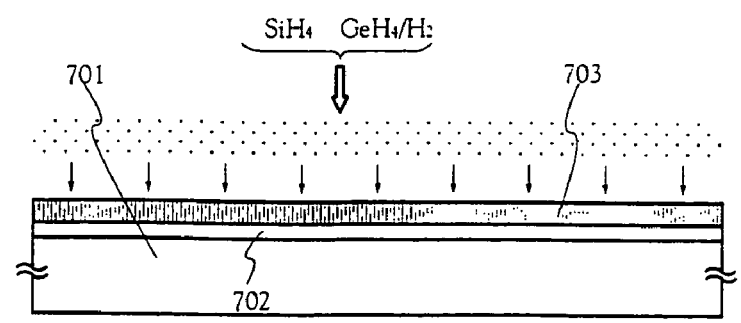
FIGS. 7A-7D are diagrams illustrating a method of forming a crystalline semiconductor film of Embodiment 1.

The method of forming the crystalline semiconductor film described with reference to FIGS. 7A-7D are the one that executes the crystallization by adding a metal element into the whole surface of the amorphous silicon film containing germanium to assist the crystallization of silicon. Referring to FIG. 7A, first, the glass substrate 701 is the one represented by the #1773 glass substrate of Coning Co. On the surface of the substrate 701, there is formed, as a blocking layer 702, a silicon nitride oxide film by using $SiH_4$ and $N_2O$ by the plasma CVD method maintaining a thickness of 100 nm. The blocking layer 702 is formed so that alkali metals contained in the glass substrate will not diffuse into the semiconductor film formed thereon.

The amorphous silicon film 703 containing germanium is formed by the plasma CVD method, and is deposited on the substrate 701 by the glow-discharge decomposition while introducing the $GeH_4$ gas diluted into 10% with $SiH_4$ and $H_2$ into the reaction chamber. The detailed conditions comply with Table 1. However, the conditions employed here are those of #SGN5 or #SGN10 or intermediate conditions thereof. The amorphous silicon film 703 containing germanium is formed maintaining a thickness of 50 nm. In order to minimize the contents of impurities such as oxygen, nitrogen and carbon in the germanium-containing amorphous silicon film 703, use is made of the $SiH_4$ gas having a purity of not lower than 99.9999% and the $GeH_4$ gas having a purity of not lower than 99.99%. The specifications of the plasma CVD device are such that the reaction chamber has a volume of 13 liters, a composite molecular pump of an evacuation rate of 300 l/sec is provided in the first stage, a dry pump of an evacuation rate of 40 $m^3$/hr is provided in the second stage, to prevent the vapor of organic matters from reversely diffusing from the side of the exhaust system, and to enhance the degree of vacuum that can be reached in the reaction chamber, so that impurity elements will not be trapped in the film as much as possible while forming the amorphous semiconductor film.

Figure 7B:
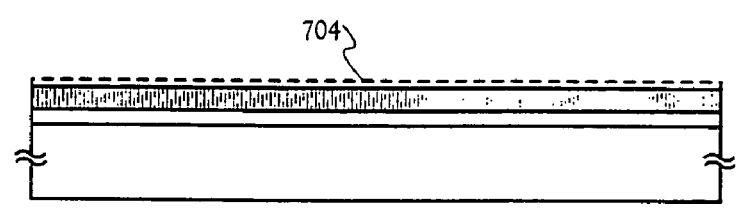

Referring to FIG. 7B, a nickel acetate solution containing nickel at a concentration of 10 ppm calculated on the basis of weight is applied by using a spinner to form a nickel-containing layer 704. Here, in order to improve compatibility for the solution, the surface of the germanium-containing amorphous silicon film 703 is treated, i.e., a very thin oxide film is formed by using an ozone-containing aqueous solution, and the oxide film is etched with a mixed solution of hydrofluoric acid and hydrogen peroxide water to form a clean surface, followed by the treatment with an aqueous solution containing ozone to form a very thin oxide film. The silicon surfaces are hydrophobic in itself and, hence, forming the oxide film makes it possible to uniformly apply the nickel acetate solution.

Figure 7C:
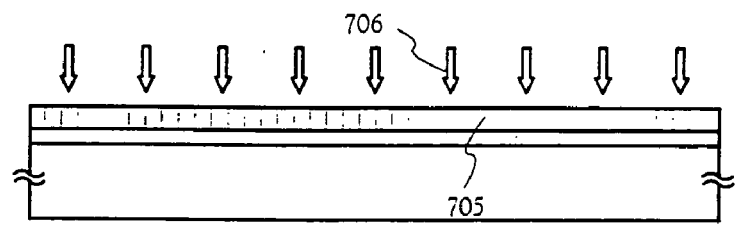

Next, heat treatment is effected at 500° C. for one hour to release hydrogen contained in the germanium-containing amorphous silicon film. Then, the crystallization is effected by conducting the heat treatment at 550° C. for 4 hours. Thus, there is formed a crystalline semiconductor film 705 as shown in FIG. 7C.

Then, in order to increase the ratio of crystallization (ratio of crystalline components in the whole volume of the film) and to repair defects remaining in the crystalline particles, the laser treatment is conducted, i.e., the crystalline semiconductor film 705 is irradiated with a laser beam 706. An excimer laser beam is used having a wavelength of 308 nm and oscillating at 30 Hz. The laser beam is focused through an optical system into 400 to 600 mJ/cm$^2$, and the laser treatment is effected at an overlapping rate of 90 to 95%. Thus, there is obtained a crystalline semiconductor film 707 shown in FIG. 7D.

Embodiment 2

Germanium can be added to the amorphous silicon film not only by the method of forming the film by using gases containing elements as represented by $SiH_4$ and $GeH_4$ by the plasma CVD method but also by a method of adding germanium by the ion injection method or the ion-doping method (or is also called plasma-doping method) after the amorphous silicon film has been formed. In the plasma CVD method, $GeH_4$ is preferentially decomposed with the same high-frequency electric power due to a difference in the dissociation energy between $SiH_4$ and $GeH_4$. In this case, unless the film-forming conditions are precisely controlled such as employing pulse discharge, a cluster of germanium is formed in the amorphous silicon film making it difficult to uniformly disperse germanium.

Figure 8A:
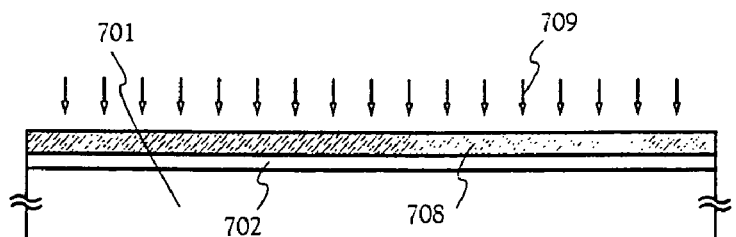
FIGS. 8A and 8B are diagrams illustrating a method of forming the crystalline semiconductor film of Embodiment 2.
Figure 8B:
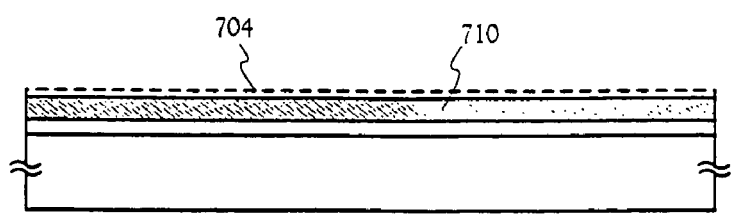

FIGS. 8A and 8B are diagrams illustrating the steps of adding germanium by the ion injection method or the ion-doping method. In FIG. 8A, a blocking layer 702 is formed on a glass substrate 701 in the same manner as in Embodiment 1, and an amorphous silicon film 708 is formed thereon maintaining a thickness of 50 nm. Germanium ions are obtained by decomposing $GeH_4$, and are injected into the amorphous silicon film at an acceleration voltage of 30 to 100 keV. The amount of addition of germanium is from 0.1 to 10 atomic %. In the ion injection method or the ion-doping method, the amount of addition of germanium is correctly controlled by controlling the acceleration voltage and the dosage. Upon injecting germanium having a mass larger than that of silicon, fine crystalline nuclei present in the amorphous silicon film are destroyed making it possible to obtain an amorphous semiconductor film which is more favorable in forming the crystalline semiconductor film.

Figure 7D:
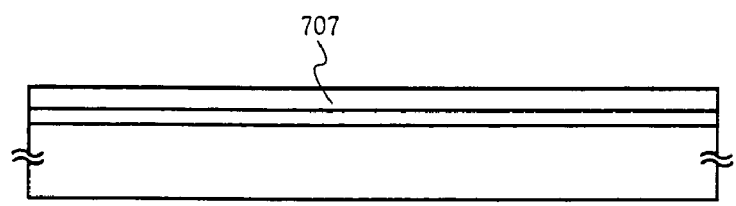

Thus, there is formed an amorphous silicon film 710 to which germanium is added as shown in FIG. 8B. Thereafter, a nickel acetate solution containing 10 ppm of nickel on the basis of weight is applied by using a spinner to form a nickel-containing layer 704. Then, the same steps as those of Embodiment 1 are effected to obtain a crystalline semiconductor film 707 as shown in FIG. 7D.

Embodiment 3

Figure 9A:
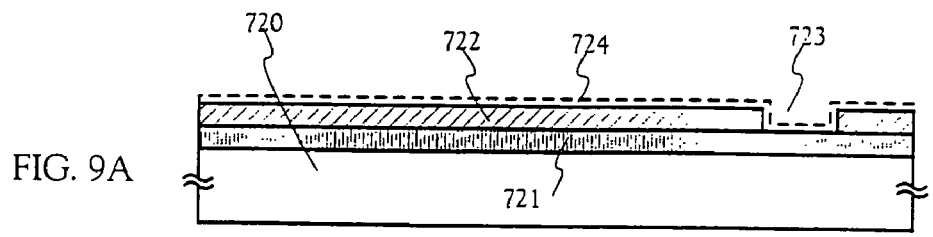
FIGS. 9A-9C are diagrams illustrating a method of forming the crystalline semiconductor film of Embodiment 3.
Figure 9B:
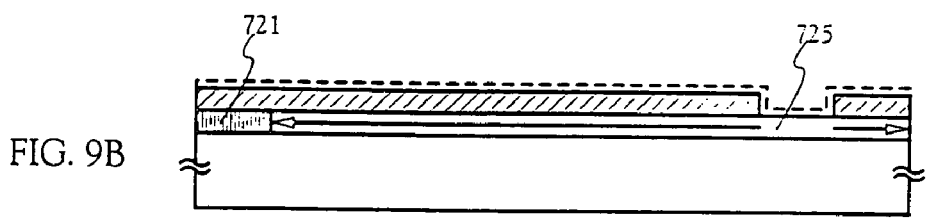
Figure 9C:
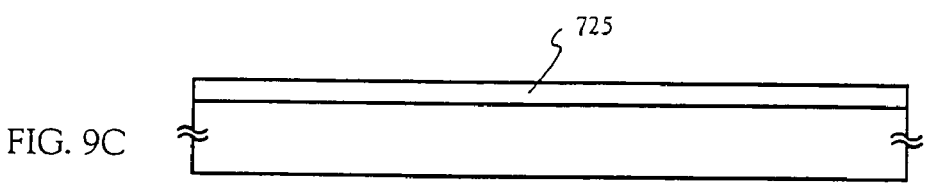

Described below with reference to FIGS. 9A-9C is a method of selectively forming the metal element that assists the crystallization of the amorphous semiconductor film. In FIG. 9A, a substrate 720 is the above-mentioned glass substrate or the quartz substrate. When the glass substrate is used, a blocking layer is formed in the same manner as in Embodiment 1.

An amorphous silicon film 721 containing germanium may be formed by the plasma CVD method like in Embodiment 1, or germanium may be introduced by the ion-injection method or by the ion-doping method as in Embodiment 2. It is also allowable to employ a method of formation by decomposing $Si_2H_6$ and $GeH_4$ at a temperature of 450 to 500° C. by the low pressure CVD method.

Then, a silicon oxide film 722 is formed maintaining a thickness of 150 nm on the amorphous silicon film 721 containing germanium. Though there is no particular limitation on the method of forming the silicon oxide film, the silicon oxide film is formed by, for example, mixing a tetraethyl orthosilicate (TEOS) and $O_2$ together and under the conditions of a reaction pressure of 40 Pa, a substrate temperature of 300 to 400° C., discharging at a high frequency (13.56 MHz) and an electric power density of 0.5 to 0.8 W/cm$^2$.

Next, an opening portion 723 is formed in the silicon oxide film 722, and a nickel acetate solution containing 10 ppm of nickel on the weight basis is applied. Then, a nickel-containing layer 724 is formed and comes in contact with the germanium-containing amorphous silicon film 721 on only the bottom of the opening portion 723.

The crystallization is effected by the heat treatment at a temperature of 500 to 650° C. for 4 to 24 hours, e.g., at 570° C. for 14 hours. In this case, the crystallization takes place first at a portion of the amorphous silicon film with which nickel is brought in contact and, then, spreads in a direction in parallel with the surface of the substrate. The thus formed crystalline silicon film 725 is constituted by a collection of rod-like or needle-like crystals, each crystal growing in a particular direction if viewed macroscopically. Thereafter, the silicon oxide film 722 is removed to obtain the crystalline silicon film 725.

Embodiment 4

The metal element used for the crystallization is remaining in the crystalline silicon film formed according to methods described in Embodiments 1 to 3. If expressed in terms of an average concentration, the metal element is remaining at a concentration in excess of $1 \times 10^{19}/cm^3$ though it may not be uniformly distributed in the film. The silicon film in such a state can be used as the channel-forming region of various semiconductor devices inclusive of TFTs. More preferably, however, it is desired to remove the metal element by gettering.

Figure 10A:
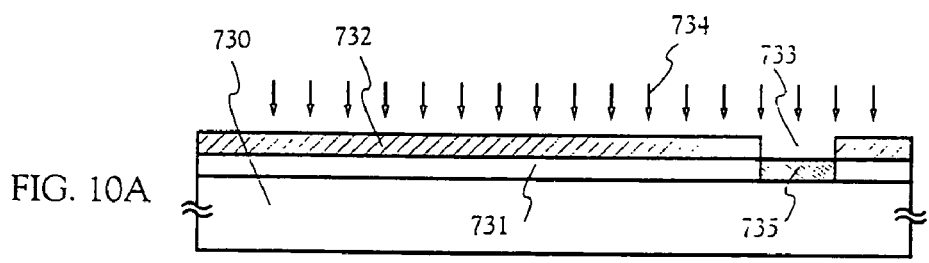
FIGS. 10A-10C are diagrams illustrating a method of forming the crystalline semiconductor film of Embodiment 4.
Figure 10B:
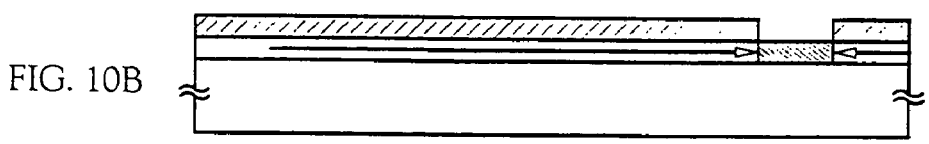
Figure 10C:
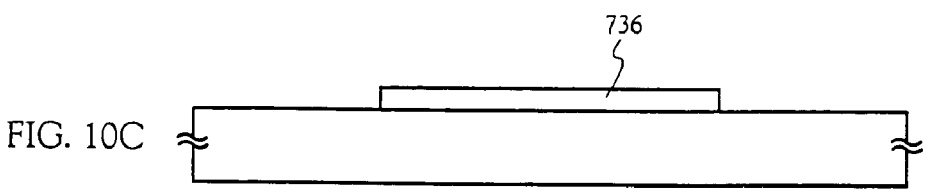

This embodiment deals with a gettering method with reference to FIGS. 10A-10C. In FIG. 10A, a substrate 730 is the glass substrate of Embodiment 1 or 2, or is the quartz substrate of Embodiment 3. When the glass substrate is used, a blocking layer is formed like in Embodiment 1. A crystalline silicon film 731 may be formed by any one of the methods of Embodiments 1 to 3. A silicon oxide film 732 for masking is formed maintaining a thickness of 150 nm on the surface of the crystalline silicon film 731, and an opening portion 733 is formed therein so that the crystalline silicon film is exposed. In the case of Embodiment 3, the silicon oxide film 722 shown in FIG. 9A can be just utilized, and a step of FIG. 9B and the subsequent step may be just transferred to the steps of this Example. Then, phosphorus is added by the ion-doping method to form a phosphorus-added region 735 having a concentration of $1 \times 10^{19}$ to $1 \times 10^{22}/cm^3$.

Referring next to FIG. 10B, the heat treatment is effected in a nitrogen atmosphere at 550 to 800° C. for 5 to 24 hours, e.g., at 600° C. for 12 hours. Then, the region 735 to which phosphorus is added works as a gettering site, and the catalytic element remaining in the crystallized silicon film 731 can be segregated in the phosphorus added region 735.

Then, referring to FIG. 10C, the silicon oxide film 732 for masking and the region 735 to which phosphorus is added are removed by etching, to obtain the crystalline silicon film 736 in which the concentration of the metal element used in the step of crystallization is decreased down to smaller than $1 \times 10^{17}/cm^3$.

Embodiment 5

Figure 11A:
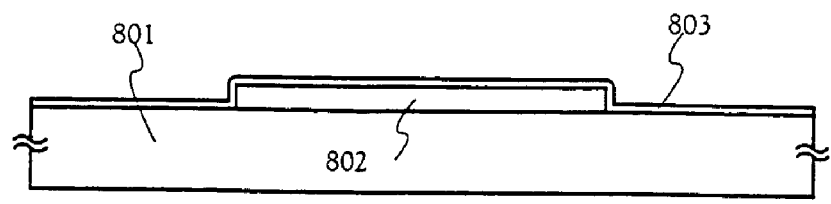
FIGS. 11A and 11B are diagrams illustrating a step of fabricating a semiconductor device of Embodiment 5.

This embodiment deals with a method that can be favorably utilized for the TFTs and the like by decreasing defects in the crystalline particles or by lowering the level of interface to the insulating film. A crystalline silicon film 801 containing germanium shown in FIG. 11A may be the one formed in Embodiment 3. Further, the crystalline silicon film 801 containing germanium may be the one subjected to the gettering described in Embodiment 4. In this embodiment, however, the substrate must have a heat resistance of at least about 700 to 1000° C. and, hence, the quartz substrate 801 is employed.

An insulating film 803 on the germanium-containing crystalline silicon film 802 is formed of a material containing silicon oxide as a chief component. For example, a silicon oxide film or a silicon nitride oxide film is formed by the plasma CVD method maintaining a thickness of 50 nm.

Figure 11B:
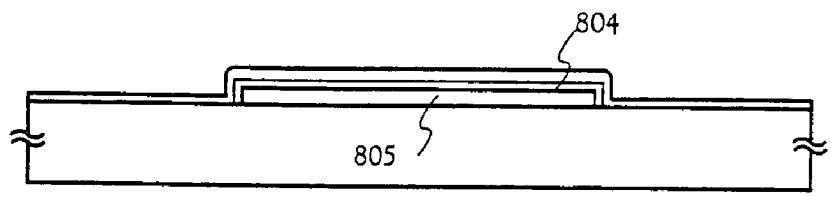

The heat treatment is effected in a state where the insulating film 803 is formed in an atmosphere containing halogen (typically chlorine) and oxygen as shown in FIG. 11B. In this embodiment, the heat treatment is effected at 950° C. for 30 minutes. The treating temperature may be selected in a range of from 700 to 1100° C., and the treating time can be selected in a range of from 10 minutes to 8 hours.

Due to the heat treatment, an oxide film 804 of about 20 nm is formed on the interface between the germanium-containing crystalline silicon film 802 and the insulating film 803, and a germanium-containing crystalline silicon film 805 is formed having a decreased thickness. Impurity elements and, particularly, metal impurity elements contained in the insulating film 803 and in the germanium-containing crystalline silicon film 802 in the step of oxidation in a halogen atmosphere, form a compound together with halogen and can, hence, be removed in the gaseous phase. The interface between the oxide film 804 and the germanium-containing crystalline silicon film 805 obtained through the above processing, has a low interfacial level density and is very favorable.

Embodiment 6

This embodiment deals with a case of forming a CMOS-type TFT by combining an n-channel TFT 920 and a p-channel TFT 921 in a complementary manner with reference to FIGS. 19A-19E.

In FIG. 19A, a crystalline silicon film containing germanium is formed on a substrate 901. The crystalline silicon film containing germanium may be any one formed by the steps of Embodiments 1 to 4. A blocking layer 902 is formed when the substrate 901 is a glass substrate. The crystalline silicon film containing germanium is etched to a predetermined size for element isolation, and island-like semiconductor layers 903 and 904 are formed.

A first insulating film 905 is utilized as a gate-insulating film for the TFT, and is formed maintaining a thickness of 30 to 200 nm. The first insulating film 905 is a silicon nitride oxide film formed of $SiH_4$ and $N_2O$ or is a silicon nitride oxide film formed of TEOS and $N_2O$ by the plasma CVD method. This embodiment selects the former film formed maintaining a thickness of 75 nm. Further, the first insulating film 905 may be formed by the method of Embodiment 5.

On the first insulating film 905 are formed gate electrodes 906, 907 of an electrically conducting material containing one or plural kinds of elements selected from tantalum, tungsten, titanium, aluminum and molybdenum.

Referring next to FIG. 19B, phosphorus is doped by the ion-doping method to form an LDD region in the n-channel TFT 920. Phosphine ($PH_3$) that is diluted into 0.1 to 5% with $H_2$ is used as the doping gas. The doping conditions will be suitably determined. Here, however, the first impurity region 908 formed in each of the semiconductor layers 903 and 904 will have an average concentration of from $1 \times 10^{17}$ to $1 \times 10^{19}/cm^3$. At this moment, the gate electrodes 906 and 907 work as masks against phosphorus that is doped, and the impurity region 908 is formed in a self-aligned manner.

Referring next to FIG. 19C, a mask 909 is formed by using a photoresist, and is doped again with phosphorus by the ion-doping method. Due to this doping, the second impurity regions 910 and 912 have an average phosphorus concentration of from $1 \times 10^{20}$ to $1 \times 10^{21}/cm^3$. Thus, the first impurity region 911 formed in the semiconductor layer 903 serves as the LDD region, and the second impurity region 910 serves as source and drain regions.

In the p-channel TFT 921 as shown in FIG. 19D, a mask 913 is formed by using a photoresist, and the semiconductor layer 904 is doped with boron. Diborane ($B_2H_6$) diluted into 0.1 to 5% with $H_2$ is used as the doping gas. A third impurity region 914 formed in the semiconductor layer 904 is added with boron in an amount 1.5 to 3 times as much as the phosphorus concentration for being inverted from the n-type into the p-type, and, hence, has an average concentration of from $1.5 \times 10^{20}$ to $3 \times 10^{21}/cm^3$. Thus, the third impurity region 914 formed in the semiconductor layer 904 serves as source and drain regions of the p-channel TFT 921.

Then, an interlayer-insulating film 915 is formed by a silicon nitride film and a silicon nitride oxide film formed by the plasma CVD method. Further, the impurity elements that are added must be heat-treated at 350 to 500° C. for being activated. The heat treatment is effected after the interlayer-insulating film 915 has been formed to release hydrogen contained in the silicon nitride film and in the silicon nitride oxide film so as to be diffused in the semiconductor layers 903 and 904 to execute the hydrogenation, thereby to compensate for the defects in the semiconductor and in the interface thereof. Further, source and drain electrodes 916 and 917 are formed to obtain the TFT.

Channel-forming regions 918 and 919 are formed of the germanium-containing crystalline silicon film which is highly oriented on the lattice plane {101}. Such channel-forming regions have good interface properties relative to the gate-insulating film, have a decreased defect density in the crystalline grain boundaries and in the crystalline particles, and make it possible to obtain a high field-effect mobility.

Through the above steps, there is obtained a CMOS-type TFT in which the n-channel TFT 920 and the p-channel TFT 921 are combined together in a complementary manner. The n-channel TFT 920 has an LDD region formed between the channel-forming region and the drain region, and prevents the concentration of electric field at the drain terminal. The above CMOS-type TFTs make it possible to form a liquid crystal display device of the active matrix type or a drive circuit of the EL display device. It is further allowable to apply the n-channel TFT or the p-channel TFT to the transistor for forming pixel portions. It is further possible to use the transistor as the TFT for realizing a thin film integrated circuit to substitute for the LSIs that have heretofore been produced by using the conventional semiconductor substrates.

Embodiment 7

Metal elements used for the crystallization are remaining in the crystalline silicon film formed according to the methods explained in Embodiments 1 to 3. This embodiment deals with a method of removing the metal element in a manner different from that of Embodiment 4. The method consists of removing the metal element by the heat treatment from the crystallized silicon film formed by adding the metal element by using, as a gettering site, a semiconductor film containing a rare gas element or a semiconductor film to which the rare gas element is added. The method will now be described with reference to FIGS. 23A-23E.

First, a crystalline silicon film which is highly oriented on the plane [101] is obtained by any one of the methods of Embodiments 1 to 3. Reference numeral 2000 denotes a substrate having an insulating surface, and 2001 denotes an underlying insulating film comprising an insulating film such as silicon oxide film, silicon nitride film or silicon nitride oxide film (SiOxNy). Here, a class substrate is used, and the underlying insulating film 2001 is the one of a two-layer structure of a laminate of a first silicon nitride oxide film of a thickness of 50 to 100 nm formed by using $SiH_4$, $NH_3$ and $N_2O$ as reaction gases and a second silicon nitride oxide film of a thickness of 100 to 150 nm formed by using $SiH_4$ and $N_2O$ as reaction gases. It is further desired to use a single layer of silicon nitride film as an underlying insulating film 2001. Use of the silicon nitride film exhibits the effect as a blocking layer that prevents the alkali metal contained in the glass substrate from diffusing into the semiconductor film that will be formed later, as well as the effect of enhancing the gettering effect in a gettering step that will be effected later. At the time of gettering, nickel tends to move into a region of a high oxygen concentration. Therefore, very great effect is obtained in using the underlying insulating film in contact with the semiconductor film as the silicon nitride film. It is further allowable to use a laminated layer structure in which the silicon nitride oxide film and the silicon nitride film are successively laminated. Or, there may be used a three-layer structure in which the first silicon nitride oxide film, the second silicon nitride oxide film and the silicon nitride film are successively laminated.

Figure 23A:
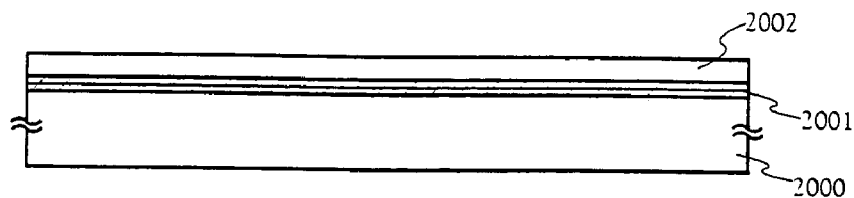
FIGS. 23A-23E are diagrams illustrating a method of forming a crystalline semiconductor film of Embodiment 8.

Next, an amorphous semiconductor film is formed on the underlying insulating film by the plasma CVD method, low pressure thermal CVD method or sputtering method, followed by the crystallization described in Embodiment 1 to form a crystalline silicon film 2002 containing germanium (FIG. 23A).

In this embodiment, the amorphous silicon film containing germanium is formed by the plasma CVD method, the $GeH_4$ gas diluted into 10% with $SiH_4$ and $H_2$ is introduced into the reaction chamber, decomposed by glow electric discharge and is deposited on the underlying insulating film 2001. On the surface of the thus obtained germanium-containing amorphous silicon film is formed a very thin oxide film by using an ozone-containing aqueous solution. The oxide film is then removed by etching with a mixed solution of hydrofluoric acid and hydrogen peroxide water to form a clean surface. Then, a very thin oxide film is formed again by the treatment with the ozone-containing aqueous solution. Thereafter, a nickel acetate solution containing 10 ppm of nickel calculated on the basis of weight is applied onto the whole surface thereof by using a spinner to thereby form a nickel-containing layer. Next, the heat treatment is effected at 500° C. for one hour to release hydrogen contained in the germanium-containing amorphous silicon film. Then, the heat treatment is conducted in an annealing furnace at 550° C. for 4 hours to effect the crystallization.

The crystallization may be effected by the irradiation with an intense light from a lamp source of light such as halogen lamp, metal halide lamp, xenon arc lamp, carbon arc lamp, high-pressure sodium lamp or a high-pressure mercury lamp in place of the heat treatment using the annealing furnace. When the lamp source of light is used, the lamp source of light for heating is maintained turned on for 60 to 240 seconds and, preferably, for 110 to 150 seconds to heat the film at 650 to 750° C. and, preferably, at 700° C.

Thus, the amorphous silicon film containing germanium is crystallized to obtain the crystalline silicon film 2002 containing germanium. During the gettering, nickel tends to migrate into a region where the oxygen concentration is high. It is therefore desired that the oxygen concentration in the germanium-containing crystalline silicon film 2002 is set to be not larger than $5 \times 10^{18}/cm^3$.

After the above crystallization, further, the segregated metal elements may be removed or decreased with an etchant containing hydrofluoric acid, such as diluted hydrofluoric acid or FPM (mixed solution of hydrofluoric acid, hydrogen peroxide water and pure water). When the surface is etched with the etchant containing hydrofluoric acid, further, it is desired to flatten the surface by the irradiation with an intense light from the above lamp source of light.

After the above crystallization, further, the film may be irradiated with an intense light such as laser beam or light from a lamp source of light to further improve the crystallization. The laser beam may be an excimer laser beam having a wavelength of not longer than 400 nm, or the second harmonics or the third harmonics of the YAG laser. After the irradiation with an intense light such as the laser beam or light from the lamp source of light for improving the crystallization, the segregated metal element may be removed or decreased with the etchant containing hydrofluoric acid. Or, the surface may be flattened by the irradiation with an intense light from the lamp source of light.

Next, the gettering is effected to remove the metal elements contained in the germanium-containing crystalline silicon film 2002. First, a barrier layer 2003 is formed on the crystalline silicon film containing germanium. As the barrier layer 2003, there is formed a porous film which permits the metal element (chiefly nickel in this case) to pass through to the gettering site but which does not permit the etching solution used in the step of removing the gettering site to infiltrate therein. Here, there may be used a chemical oxide film formed by the treatment with ozone water and a silicon oxide film (SiOx). In this specification, the film having such properties is particularly referred to as porous film. Further, the barrier layer 2003 may be very thin, and may be a spontaneously oxidized film or may be an oxide film oxidized by generating ozone by the irradiation with ultraviolet rays in an atmosphere containing oxygen.

Figure 23B:
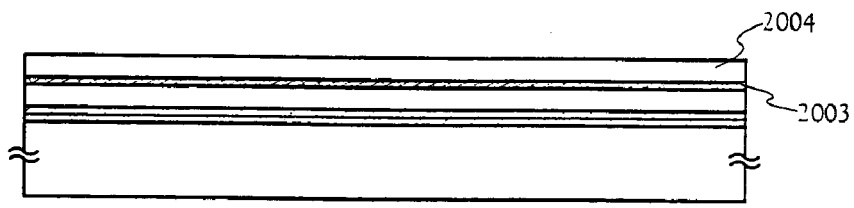
Figure 23C:
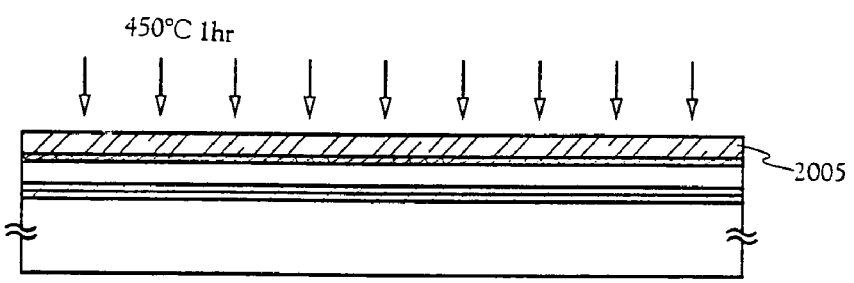

Next, a semiconductor film 2004 is formed on the barrier layer 2003 to work as a gettering site in a subsequent treatment of gettering (FIG. 23B). The semiconductor film 2004 is the one having an amorphous structure formed by the plasma CVD method, low pressure thermal CVD method or, preferably, sputtering method. The semiconductor film 2004 has a thickness of 50 to 200 nm and, preferably, 150 nm. In the subsequent treatment of gettering, nickel tends to migrate into a region having a high oxygen concentration. It is therefore desired that the semiconductor film 2004 contains oxygen (at a concentration of not lower than $5 \times 10^{18}/cm^3$ and, preferably, not lower than $1 \times 10^{19}/cm^3$ as measured by the SIMS analysis) to improve the gettering efficiency. There is further formed a semiconductor film containing a rare gas element at a concentration of $1 \times 10^{20}/cm^3$.

The most preferred method of forming the semiconductor film is such that silicon is used as the target by the sputtering method, and a rare gas is used as the sputtering gas. According to the sputtering method, the pressure is decreased at the time of forming the film so that the rare gas is easily trapped in the semiconductor film. This makes it possible to form a semiconductor film containing the rare gas element at a concentration of $1 \times 10^{20}$ to $5 \times 10^{21}/cm^3$ and, preferably, $1 \times 10^{20}$ to $1 \times 10^{21}/cm^3$.

The rare gas element is one or plural kinds of those selected from He, Ne, Ar, Kr and Xe. Upon injecting the ions thereof into the semiconductor film being accelerated in an electric field, it is allowed to form a gettering site while forming dangling bonds and lattice distortions. Among them, it is desired to use the Ar gas which is cheaply available. The treating time for adding the rare gas element may be as short as about one minute or two minutes, enabling the rare gas element of a high concentration to be added to the semiconductor film. Therefore, the throughput is strikingly improved compared with the gettering using phosphorus.

In addition to the rare gas element, there may be further added one or plural kinds of elements selected from H, $H_2$, O, $O_2$, P and B. Upon adding plural kinds of elements, the gettering effect is obtained in a synergistic way.

Thereafter, the gettering is effected by the heat treatment or by being irradiated with an intense light from a lamp source of light. When the gettering is to be effected by the heat treatment, the heat treatment may be executed in a nitrogen atmosphere at 450 to 800° C. for 1 to 24 hours, for example, at 500° C. for 4 hours. Further, when the gettering is to be effected by the irradiation with an intense light from a lamp source of light, the lamp source of light for heating is maintained turned on for 120 to 300 seconds and, preferably, for 180 seconds to conduct the heat treatment at 650 to 750° C.

Figure 23D:
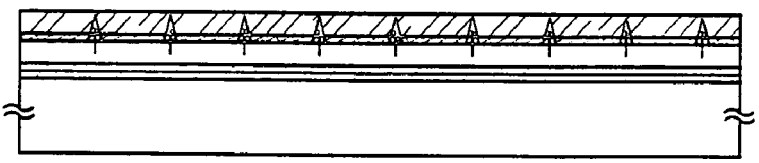

Due to the gettering, nickel migrates in the direction of arrows (vertical direction) in FIG. 23D whereby the metal elements are removed from the germanium-containing crystalline silicon film 2002 covered by the barrier layer 2003 or the concentration of the metal element decreases. Compared to the gettering using phosphorus, the gettering by the addition of a rare gas element is very effective, enabling the addition to be effected at a high concentration, e.g., $1 \times 10^{20}$ to $5 \times 10^{21}/cm^3$, and, hence, enabling the metal element to be added in an increased amount for executing the crystallization. That is, upon increasing the amount of addition of metal element for the crystallization, the crystallization can be effected in a further shortened period of time. When the time for crystallization is not changed, the metal element added in an increased amount makes it possible to further lower the temperature for crystallization. Upon adding the metal element in an increased amount for the crystallization, further, nuclei are spontaneously generated in decreased amounts and it is allowed to form a favorable crystalline semiconductor film.

After the above gettering treatment, the gettering site 2005 which is the semiconductor film is selectively removed by etching. The etching method may be dry etching using $ClF_3$ but not using plasma, or wet etching using an alkali solution such as an aqueous solution containing hydrazine or tetraethylammonium hydroxide (chemical formula, $(CH_3)_4NOH$)). Here, the barrier layer 2003 works as an etching stopper. The barrier layer 2003 may then be removed with hydrofluoric acid.

Figure 23E:
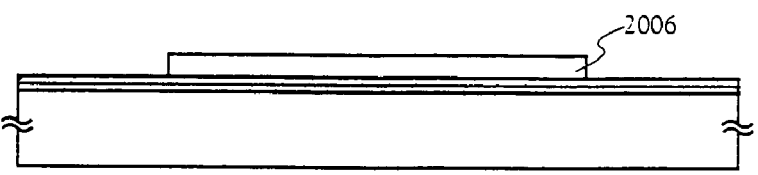

Thereafter, the germanium-containing crystalline silicon film is etched into a desired shape to form a semiconductor layer 2006 isolated like an island (FIG. 23E).

Figure 24A:
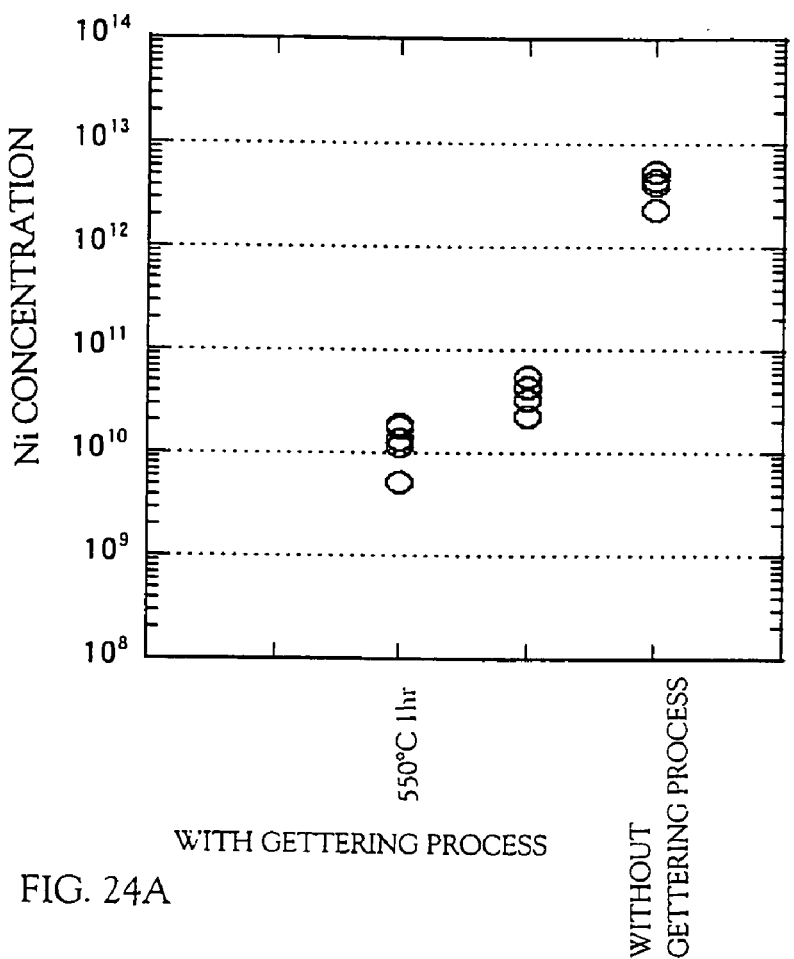
FIG. 24A is a graph illustrating the concentrations of metal elements measured by TXRF (Total Reflection X-ray Fluorescene Spectroscopy) before and after the gettering treatment and FIG. 24B os a diagram explaining a measuring method of TXRF of Embodiment 7.
Figure 24B:
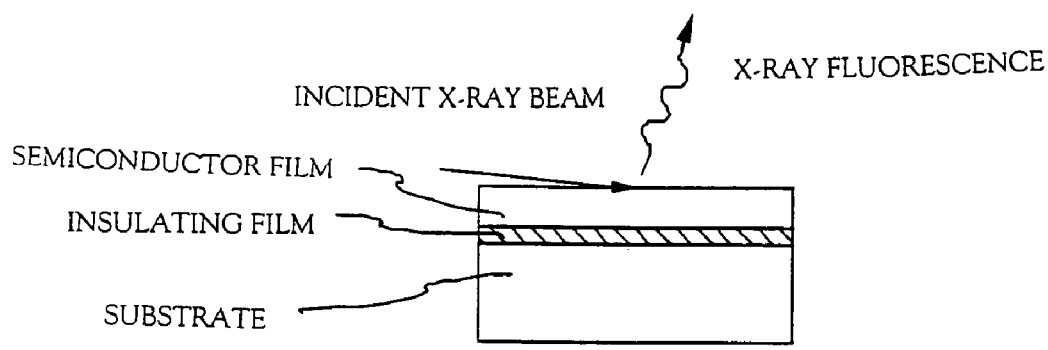

FIGS. 24A and 24B show the results of measuring the concentration of a metal element (nickel here) before and after the gettering treatment (by the total reflection X-ray fluorescence spectroscopy (TXRF)). As shown in FIG. 24B, the TXRF is a measuring method according to which an X-ray beam is permitted to be incident on the surface of the film at a very shallow angle to detect the X-ray fluorescence emitted by impurities such as metal elements. The TXRF gives data chiefly from a depth of 3 to 5 nm from the surface, and makes it further possible to estimate the concentration of nickel remaining in the crystalline silicon film. The sensitivity of detection is nearly $10^{10}/cm^2$.

In FIG. 24A, the ordinate represents the concentration of nickel. The data of the sample without the gettering treatment include a value of $5 \times 10^{12}$ (arbitrary value). However, the samples subjected to the gettering treatment exhibit smaller values, from which it is learned that the nickel concentration in the crystalline semiconductor film is decreased down to about one-hundredth through the gettering treatment. When the gettering treatments conducted at temperatures of 450° C. and 500° C. are compared to each other, it will be learned that the nickel concentration is lowered more in the case of 500° C.

The germanium-containing crystalline silicon film obtained in this embodiment is highly oriented on the plane [101] and contains metal elements at concentrations that are sufficiently low in the film, and makes it possible to lower the off current in the TFT characteristics.

Embodiment 8

The semiconductor device of this invention can be applied to the circuits to substitute for the display devices and integrated circuits of a variety of electronic devices and to substitute for the conventional integrated circuits. Such semiconductor devices include portable data terminals (electronic notebook, mobile computer, cell phone, etc.), video camera, still camera, personal computer, TV and projector. Their examples are shown in FIGS. 20A to 22D.

Figure 20A:
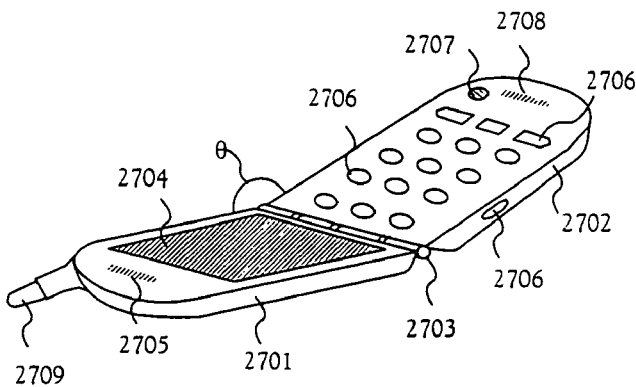
FIGS. 20A-20E are diagrams illustrating examples of electronic devices of Embodiment 8.

FIG. 20A shows a cell phone which comprises a display panel 2701, an operation panel 2702 and a connection portion 2703, the display panel 2701 including a display device 2704, a voice output unit 2705 and an antenna 2709. The operation panel 2702 includes operation keys 2706, a power source switch 2707, a voice input unit 2708, etc. This invention forms the display device 2704.

Figure 20B:
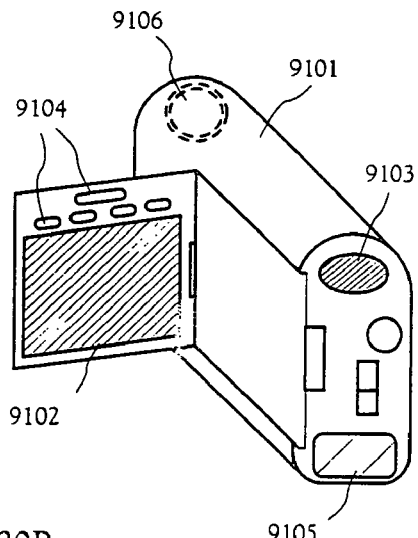

FIG. 20B shows a video camera which comprises a main body 9101, a display device 9102, a voice input unit 9103, operation switches 9104, a battery 9105 and a picture unit 9106. The invention can be applied to the display device 9102.

Figure 20C:
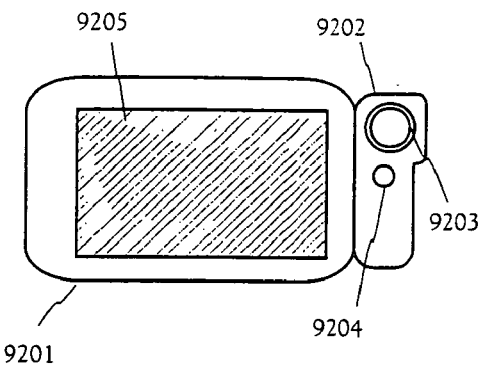

FIG. 20C shows a mobile computer or a portable data terminal which is constituted by a main body 9201, a camera unit 9202, a picture unit 9203, operation switches 9204 and a display device 9205. The semiconductor device of this invention can be applied to the display device 9205.

Figure 20D:
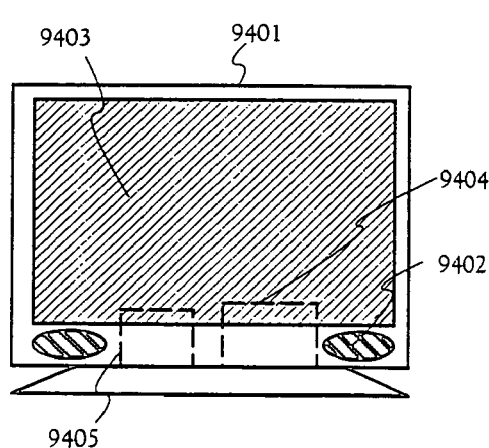

FIG. 20D shows a TV receiver constituted by a main body 9401, a speaker 9402, a display device 9403, a receiver unit 9404 and an amplifier unit 9405. The invention can be applied to the display device 9403.

Figure 20E:
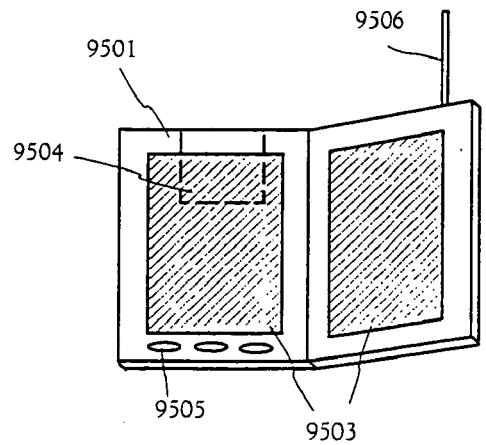

FIG. 20E shows a portable notebook constituted by a main body 9501, display devices 9503, a storage medium 9504, operation switches 9505 and an antenna 9506, which is used for displaying data stored in a mini-disk (MD) or in a DVD and for displaying data received by the antenna. The invention can be applied to the display devices 9503 and to the storage medium 9504.

Figure 21A:
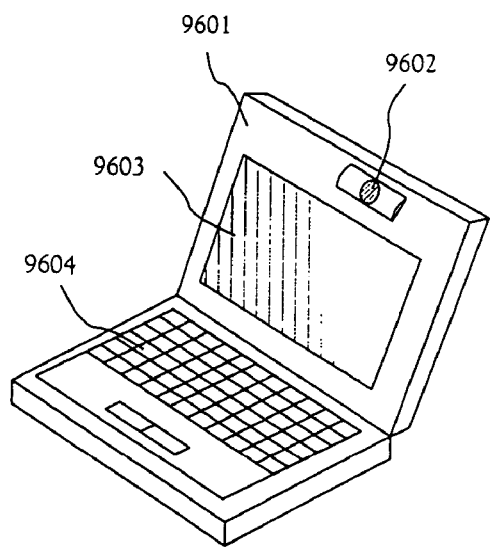
FIGS. 21A-21C are diagrams illustrating examples of electronic devices of Embodiment 8.

FIG. 21A shows a personal computer constituted by a main body 9601, an image input unit 9602, a display device 9603 and a keyboard 9604. The invention can be applied to the display device 9603 and to various integrated circuits contained therein.

Figure 21B:
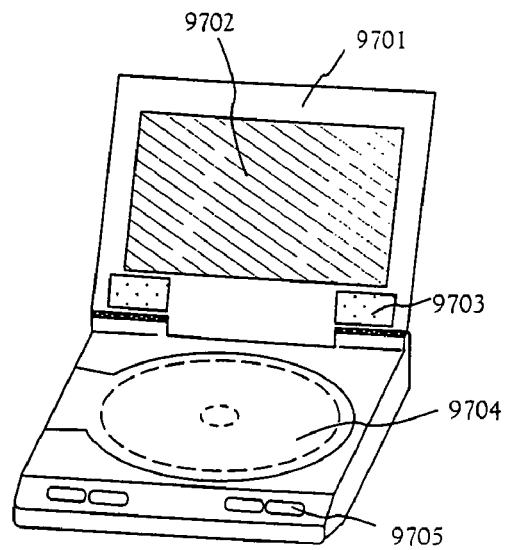

FIG. 21B shows a player using a recording medium recording a program (hereinafter referred to as recording medium), which is constituted by a main body 9701, a display device 9702, a speaker unit 9703, a recording medium 9704 and operation switches 9705. This device uses a DVD (digital versatile disc) or a CD as a recording medium, with which the user can enjoy appreciating music, movies, or playing games or internet. The invention can be applied to the display device 9702 and to various integrated circuits contained therein.

Figure 21C:
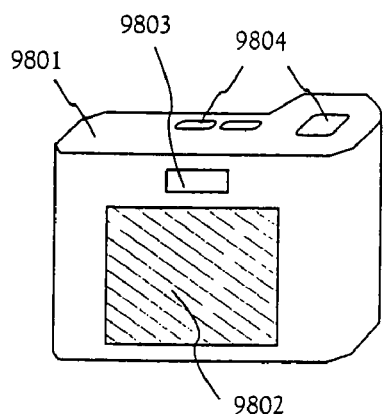

FIG. 21C shows a digital camera constituted by a main body 9801, a display device 9802, an eyepiece unit 9803, operation switches 9804 and a picture unit (not shown). The invention can be applied to the display device 9802 and to various integrated circuits contained therein.

Figure 22A:
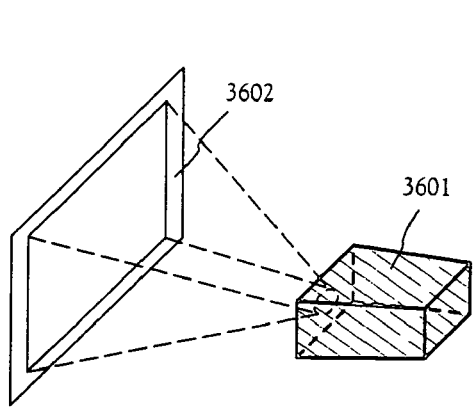
FIGS. 22A-22D are diagrams illustrating an example of a projector of Embodiment 8.

FIG. 22A shows a front-type projector constituted by a projector 3601 and a screen 3602. The invention can be applied to the projector 3601 and to other signal control circuits.

Figure 22B:
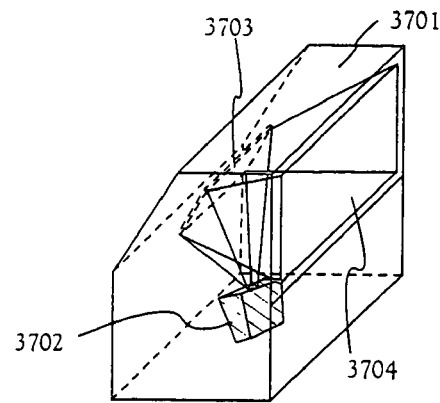

FIG. 22B shows a rear-type projector constituted by a main body 3701, a projector 3702, a mirror 3703 and a screen 3704. The invention can be applied to the projector 3702 and other signal control circuits.

Figure 22C:
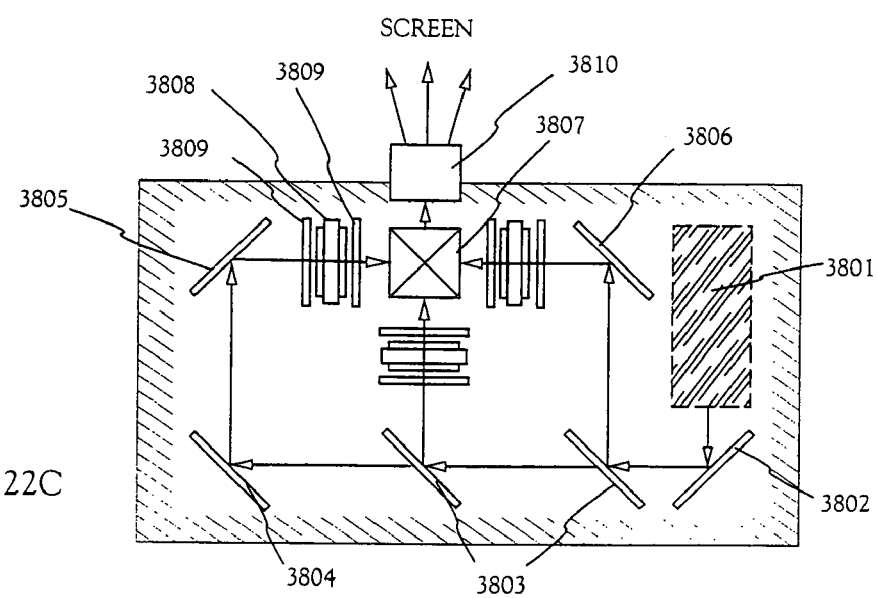

FIG. 22C is a diagram illustrating structures of the projectors 3601 and 3702 in FIGS. 22A and 22B. The projectors 3601, 3702 are constituted by an optical system 3801 of a source of light, mirrors 3802, 3804 to 3806, a dichroic mirror 3803, a prism 3807, a liquid crystal display device 3808, a phase difference plate 3809 and a projection optical system 3810. The projection optical system 3810 is constituted by an optical system inclusive of a projection lens. Though this embodiment shows an example of the three-plate type, there may be employed the one of the single-plate type without being limited thereto. In the optical paths indicated by arrows in FIG. 22C, further, the user may suitably provide an optical system such as an optical lens, a film having a polarizing function, a film for adjusting the phase difference or an IR film.

Figure 22D:
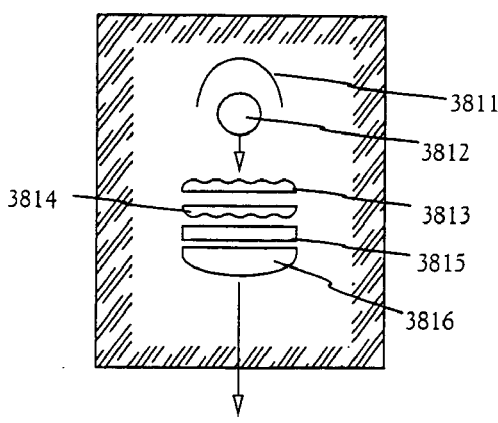

FIG. 22D is a diagram illustrating the structure of the optical system 3801 of the source of light in FIG. 22C. In this embodiment, the optical system 3801 of the source of light is constituted by a reflector 3811, a source of light 3812, lens arrays 3813, 3814, a polarizer/converter element 3815 and a focusing lens 3816. The optical system of the source of light shown in FIG. 22D is only an example, and is not particularly limited thereto only. For example, the user may suitably provide the optical system of the source of light with an optical system such as an optical lens, a film having a polarizing function, a film for adjusting the phase difference or an IR film.

Though not diagramed, the invention can be further applied as a display device to navigation systems as well as to refrigerators, washing machines, microwave ovens and fixed telephones. Thus, the invention finds a very wide range of applications and can be applied to a variety of products.

As described above, this invention makes it possible to obtain a crystalline semiconductor film by heat-treating and crystallizing an amorphous semiconductor film containing silicon as a main component and germanium in an amount of not smaller than 0.1 atomic % but not larger than 10 atomic % (preferably, not smaller than 1 atomic % but not larger than 5 atomic %) while adding a metal element thereto, wherein an orientation ratio of the lattice plane {101} is not smaller than 20% and the lattice plane {101} has an angle of not larger than 10 degrees with respect to the surface of the semiconductor film, and an orientation ratio of the lattice plane {001} is not larger than 3% and the lattice plane {001} has an angle of not larger than 10 degrees with respect to the surface of the semiconductor film, and an orientation ratio of the lattice plane {001} is not larger than 5% and the lattice plane {111} has an angle of not larger than 10 degrees with respect to the surface of the semiconductor film as detected by the electron backscatter diffraction pattern method.

The TFTs using the crystalline semiconductor film having a highly oriented lattice plane {101} can be used for fabricating active matrix liquid crystal display devices and EL display devices, and for realizing thin film integrated circuits to substitute for the LSIs that are produced by using the conventional semiconductor substrates.

What is claimed is:
1. A thin film transistor comprising:
at least a channel forming region in a crystalline semiconductor film comprising silicon,
wherein an orientation ratio of a lattice plane {101} of the crystalline semiconductor film is not smaller than 20% and the lattice plane {101} has an angle of not larger than 10 degrees with respect to a surface of the crystalline semiconductor film,
wherein an orientation ratio of a lattice plane {001} of the crystalline semicoductor film is not larger than 3%, and the lattice plane {001} has an angle of not larger than 10 degrees with respect to a surface of the crystalline semiconductor film,
wherein an orientation ratio of a lattice plane {111} of the crystalline semiconductor film is not larger than 5%, and the lattice plane {111} has an angle not larger than 10 degrees with respect to a surface of the crystalline semiconductor film, and wherein the lattice plane {101}, {001} and {111} are detected by an electron backscatter diffraction pattern method.

2. The thin film transistor of claim 1, wherein the crystalline semiconductor film comprises nitrogen and carbon each at a concentration smaller than $5 \times 10^{18}/cm^3$, and oxygen at a concentration smaller than $1 \times 10^{19}/cm^3$.

3. The thin film transistor of claim 1, wherein the crystalline semiconductor film comprises germanium at a concentration not less than 0.1 atomic % but not greater than 10 atomic %.

4. The thin film transistor of claim 3, wherein the crystalline semiconductor film comprises nitrogen and carbon each at a concentration less than $5 \times 10^{18}/cm^3$, and oxygen at a concentration less than $1 \times 10^{19}/cm^3$.

5. A transistor according to claim 1,
wherein the crystalline semiconductor film comprises a metal element at a concentration less than $1 \times 10^{17}/cm^3$.

6. A transistor according to claim 1,
wherein the crystalline semiconductor film comprises at least a metal element selected from the group consisting of Fe, Co, Ni, Ru, Rh, Pd, Os, Ir, Pt, Cu and Au.

7. A transistor according to claim 1,
wherein the crystalline semiconductor film has a thickness in a range of 20 to 100 nm.

8. A transistor according to claim 1,
wherein the crystalline semiconductor film comprises hydrogen or a halogen element.

9. A thin film transistor comprising:
at least a channel forming region in a crystalline semiconductor film comprising silicon,
wherein an orientation ratio of a lattice plane {101} of the crystalline semiconductor film is not smaller than 5%, and the lattice plane {101} has an angle of not larger than 5 degrees with respect to a surface of the crystalline semiconductor film,
wherein an orientation ratio of a lattice plane {001} of the crystalline semiconductor film is not larger than 3%, and the lattice plane {001} has an angle of not larger than 10 degrees with respect to a surface of the crystalline semiconductor film,
wherein an orientation ratio of a lattice plane {111} of the crystalline semiconductor film is not larger than 5%, and the lattice plane {111} has an angle of not larger than 10 degrees with respect to a surface of the crystalline semiconductor film, and
wherein the lattice plane {101}, {001} and {111} are detected by an electron backscatter diffraction pattern method.

10. The thin film transistor of claim 9, wherein the crystalline semiconductor film comprises nitrogen and carbon each at a concentration smaller than $5 \times 10^{18}/cm^3$, and oxygen at a concentration smaller than $1 \times 10^{19}/cm^3$.

11. The thin film transistor of claim 9, wherein the crystalline semiconductor film comprises gemianium at a concentration not less than 0.1 atomic % but not greater than 10 atomic %.

12. The thin film transistor of claim 11, wherein the crystalline semiconductor film comprises nitrogen and carbon each at a concentration less than $5 \times 10^{18}/cm^3$, and oxygen at a concentration less than $1 \times 10^{19}/cm^3$.

13. A transistor according to claim 9,
wherein the crystalline semiconductor film comprises a metal element at a concentration less than $1 \times 10^{17}/cm^3$.

14. A transistor according to claim 9,
wherein the crystalline semiconductor film comprises at least a metal element selected from the group consisting of Fe, Co, Ni, Ru, Rh, Pd, Os, Ir, Pt, Cu and Au.

15. A transistor according to claim 9,
wherein the crystalline semiconductor film has a thickness in a range of 20 to 100 nm.

16. A transistor according to claim 9,
wherein the crystalline semiconductor film comprises hydrogen or a halogen element.

17. A semiconductor device comprising:
at least a channel forming region in a crystalline semiconductor film comprising silicon,
wherein an orientation ratio of a lattice plane {101} of the crystalline semiconductor film is not smaller than 20%, and the lattice plane {101} has an angle of not larger than 10 degrees with respect to a surface of the crystalline semiconductor film,
wherein an orientation ratio of a lattice plane {001} of the crystalline semiconductor film is not larger than 3%, and the lattice plane {001} has an angle of not larger than 10 degrees with respect to a surface of the crystalline semiconductor film,
wherein an orientation ratio of a lattice plane {111} of the crystalline semiconductor film is not larger than 5%, and the lattice plane {111} has an angle of not larger than 10 degrees with respect to a surface of the crystalline semiconductor film, and
wherein the lattice plane {101}, {001} and {111} are detected by an electron backscatter diffraction pattern method.

18. The semiconductor device of claim 17, wherein the crystalline semiconductor film comprises nitrogen and carbon each at a concentration less than $5 \times 10^{18}/cm^3$, and oxygen at a concentration less than $1 \times 10^{19}/cm^3$.

19. The semiconductor device of claim 17, wherein the crystalline semiconductor film comprises germanium at a concentration not less than 0.1 atomic % but not greater than 10 atomic %.

20. The semiconductor device of claim 19, wherein tha crystalline semiconductor film comprises nitrogen and carbon each at a concentration less than $5 \times 10^{18}/cm^3$, and oxygen at a concentration less than $1 \times 10^{19}/cm^3$.

21. A device according to claim 17, wherein the crystalline semiconductor film comprises a metal element at a concentration less than $1 \times 10^{17}/cm^3$.

22. A device according to claim 17,
wherein the crystalline semiconductor film comprises at least a metal element selected from the group consisting of Fe, Co, Ni, Ru, Rh, Pd, Os, Ir, Pt, Cu and Au.

23. A device according to claim 17,
wherein the crystalline semiconductor film has a thickness in a range of 20 to 100 nm.

24. A device according to claim 17,
wherein the crystalline semiconductor film comprises hydrogen or a halogen element.

25. A device according to claim 17,
wherein the semiconductor device comprises one selected from the group consisting of a cell phone, a video camera, a mobile computer, a portable data terminal, a TV receiver, a portable notebook, a personal computer, a player using a recording medium recording a program, a digital camera, a front-type projector and a rear-type projector.

26. A semiconductor device comprising:
at least a channel forming region in a crystalline semiconductor film comprising silicon,
wherein an orientation ratio of a lattice plane {101} of the crystalline semiconductor film is not smaller than 5%, and the lattice plane {101} has an angle of not larger than 5 degrees with respect to a surface of the crystalline semiconductor film,
wherein an orientation ratio of a lattice plane {001} of the crystalline semiconductor film is not larger than 3%, and the lattice plane {001} has an angle of not larger than 10 degrees with respect to a surface of the crystalline semiconductor film,
wherein an orientation ratio of a lattice plane {111} of the crystalline semiconductor film is not larger than 5%, and the lattice plane {111} has an angle of not larger than 10 degrees with respect to a surface of the crystalline semiconductor film, and
wherein the lattice plane {101}, {001} and {111} detected by an electron backscatter diffraction pattern method.

27. The semiconductor device of claim 26, wherein the crystalline semiconductor film comprises nitrogen and carbon each at a concentration less than $5 \times 10^{18}/cm^3$, and oxygen at a concentration less than $1 \times 10^{19}/cm^3$.

28. The semiconductor device of claim 26, wherein the crystalline semiconductor film comprises germanium at a concentration not less than 0.1 atomic % but not greater than 10 atomic %.

29. The semiconductor device of claim 28, wherein the crystalline semiconductor film comprises nitrogen and carbon each at a concentration less than $5 \times 10^{18}/cm^3$, and oxygen at a concentration less than $1 \times 10^{19}/cm^3$.

30. A device according to claim 26,
wherein the crystalline semiconductor film comprises a metal element at a concentration less than $1 \times 10^{17}/cm^3$.

31. A device accordivg to claim 26,
wherein the crystalline semiconductor film comprises at least a metal element selected from the group consisting of Fe, Co, Ni, Ru, Rh, Pd, Os, Ir, Pt, Cu and Au.

32. A device according to claim 26,
wherein the crystalline semiconductor film has a thickness in a range of 20 to 100 nm.

33. A device according to claim 26,
wherein the crystalline semiconductor film comprises hydrogen or a halogen element.

34. A device according to claim 26,
wherein the semiconductor device comprises one selected from the group consisting of a cell phone, a video camera, a mobile computer, a portable data terminal, a TV receiver, a portable notebook, a personal computer, a player using a recording medium recording a program, a digital camera, a front-type projector and a rear-type projector.

* * * * *